(12) United States Patent
Saotome et al.

(10) Patent No.: US 10,235,929 B2
(45) Date of Patent: Mar. 19, 2019

(54) FIELD-EFFECT TRANSISTOR (FET) HAVING GATE OXIDE INSULATING LAYER INCLUDING SI AND ALKALINE EARTH ELEMENTS, AND DISPLAY ELEMENT, IMAGE DISPLAY AND SYSTEM INCLUDING FET

(71) Applicants: Ryoichi Saotome, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Sadanori Arae, Kanagawa (JP); Minehide Kusayanagi, Kanagawa (JP)

(72) Inventors: Ryoichi Saotome, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Sadanori Arae, Kanagawa (JP); Minehide Kusayanagi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 46 days.

(21) Appl. No.: 15/289,243

(22) Filed: Oct. 10, 2016

(65) Prior Publication Data

US 2017/0116916 A1 Apr. 27, 2017

(30) Foreign Application Priority Data

Oct. 23, 2015 (JP) .................................. 2015-209335
Aug. 8, 2016 (JP) .................................. 2016-155752

(51) Int. Cl.
*G09G 3/3225* (2016.01)
*G09G 3/34* (2006.01)
(Continued)

(52) U.S. Cl.
CPC ... *G09G 3/3225* (2013.01); *H01L 21/823462* (2013.01); *H01L 27/124* (2013.01);
(Continued)

(58) Field of Classification Search
CPC .............. H01L 27/124; H01L 27/1225; H01L 29/0847; H01L 29/0154; H01L 29/517;
(Continued)

(56) References Cited

U.S. PATENT DOCUMENTS

2005/0116263 A1* 6/2005 Lu .................... C12Q 1/6825
257/252
2011/0128275 A1* 6/2011 Ueda .................. H01L 27/1225
345/212
(Continued)

FOREIGN PATENT DOCUMENTS

CN 104823270 A 8/2015
JP 2007-158146 6/2007
(Continued)

OTHER PUBLICATIONS

K.Nomura, et al., Room-temperature fabrication of transparent flexible thinfilm transistors using amorphous oxide semiconductors, Nature, vol. 432, (Nov. 25, 2004) pp. 488-492.
(Continued)

*Primary Examiner* — Darlene M Ritchie
(74) *Attorney, Agent, or Firm* — Cooper & Dunham LLP

(57) ABSTRACT

A field-effect transistor includes a gate electrode to apply a gate voltage, a source electrode and a drain electrode to take electric current out, a semiconductor layer disposed adjacent to the source electrode and the drain electrode, and a gate insulating layer disposed between the gate electrode and the semiconductor layer, wherein the gate insulating layer includes an oxide including silicon and one or two or more alkaline earth metal elements.

8 Claims, 10 Drawing Sheets

(51) Int. Cl.
*H01L 29/786* (2006.01)
*H01L 21/8234* (2006.01)
*H01L 27/12* (2006.01)
*G09G 3/36* (2006.01)

(52) U.S. Cl.
CPC ...... *H01L 27/1225* (2013.01); *H01L 29/7869* (2013.01); *G09G 3/344* (2013.01); *G09G 3/3406* (2013.01); *G09G 3/348* (2013.01); *G09G 3/3648* (2013.01); *G09G 2310/0264* (2013.01)

(58) Field of Classification Search
CPC ............ H01L 29/401; H01L 29/42316; H01L 29/4234; H01L 29/51; H01L 29/7869; H01L 21/02164; H01L 21/0228; H01L 21/02565; H01L 21/02554; H01L 21/823857; H01L 21/823462; G09G 3/3225; G09G 3/3406; G09G 3/344; G09G 3/3648; G09G 3/348; G09G 2310/0264
See application file for complete search history.

(56) References Cited

U.S. PATENT DOCUMENTS

| | | | |
|---|---|---|---|
| 2012/0037901 A1* | 2/2012 | Mori | H01L 29/78693 257/43 |
| 2013/0285045 A1* | 10/2013 | Sasaki | H01L 29/7869 257/43 |
| 2013/0288435 A1* | 10/2013 | Kelwing | H01L 21/28088 438/197 |
| 2014/0061653 A1* | 3/2014 | Kim | H01L 29/66969 257/59 |
| 2014/0159026 A1* | 6/2014 | Okumoto | H01L 29/786 257/40 |
| 2014/0299877 A1* | 10/2014 | Nakamura | H01L 29/7869 257/43 |
| 2015/0001531 A1 | 1/2015 | Ueda et al. | |
| 2015/0028334 A1 | 1/2015 | Matsumoto et al. | |
| 2015/0108454 A1* | 4/2015 | Kim | H01L 29/7869 257/40 |
| 2015/0255327 A1* | 9/2015 | Park | H01L 27/124 438/668 |
| 2015/0263116 A1* | 9/2015 | Qiu | H01L 21/28581 257/194 |
| 2015/0349138 A1 | 12/2015 | Sone et al. | |
| 2016/0013215 A1 | 1/2016 | Ueda et al. | |
| 2016/0042947 A1 | 2/2016 | Nakamura et al. | |
| 2017/0133419 A1* | 5/2017 | Watanabe | H01L 31/101 |

FOREIGN PATENT DOCUMENTS

| | | |
|---|---|---|
| JP | 2010-074148 | 4/2010 |
| JP | 2011-077515 | 4/2011 |
| JP | 2012-191008 | 10/2012 |
| JP | 2013-030784 | 2/2013 |
| JP | 2014-107527 | 6/2014 |
| WO | 2014/157733 A1 | 10/2014 |

OTHER PUBLICATIONS

Jan. 2, 2019 Chinese official action in connection with corresponding Chinese patent application No. 201610915838.2.

* cited by examiner

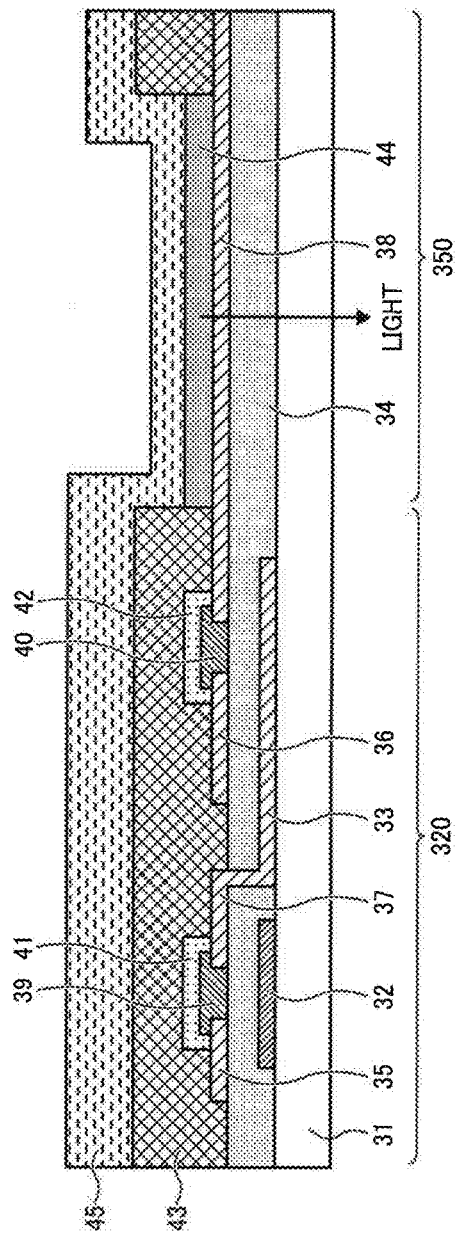
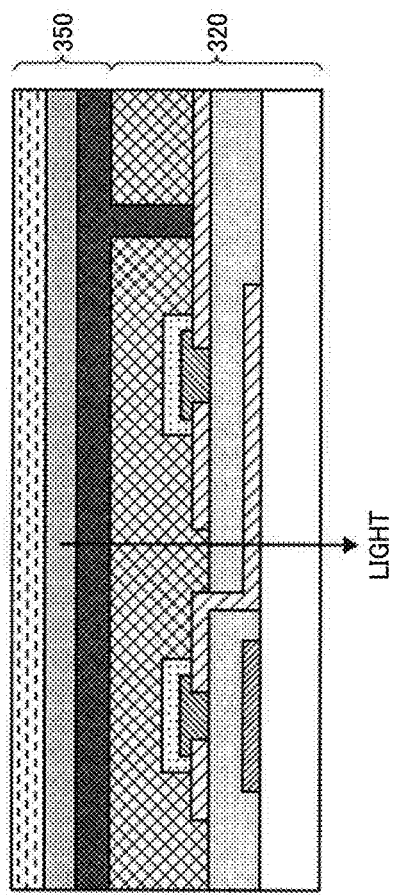
FIG. 5
FIG. 6

FIELD-EFFECT TRANSISTOR (FET) HAVING GATE OXIDE INSULATING LAYER INCLUDING SI AND ALKALINE EARTH ELEMENTS, AND DISPLAY ELEMENT, IMAGE DISPLAY AND SYSTEM INCLUDING FET

CROSS-REFERENCE TO RELATED APPLICATIONS

This patent application is based on and claims priority pursuant to 35 U.S.C. § 119 to Japanese Patent Application Nos. 2015-209335 and 2016-155752, filed on Oct. 23, 2015 and Aug. 8, 2016, respectively, in the Japan Patent Office, the entire disclosures of which are hereby incorporated by reference herein.

BACKGROUND

Technical Field

The present invention relates to a field-effect transistor, a display element, an image display, a system, and a composition.

Description of the Related Art

Field effect transistors (FET) control an electric current between a source electrode and a drain electrode according to the principle in which an electric field is applied to a gate electrode to provide a gate against flows of electrons or holes due to an electric field of a channel.

Due to this characteristic, FETs are utilized as switching elements and amplifying elements, etc. Moreover, since FETs have planar configurations and the gate electric current is low, fabrication and integration of FETs are easy in comparison with bipolar transistors. Therefore, FETs are indispensable elements to integrated circuits for use in current electronic devices. FETs are, for example, applied to a display employing active matrix format as thin film transistors (TFTs).

Also, as flat panel displays (FPDs), liquid displays, organic electroluminescence displays, and electronic paper, FETs are put to practical use.

Also, as flat panel displays (FPDs), liquid displays, organic electroluminescence displays, and electronic paper are put to practical use.

These FPDs are driven by a driving circuit including TFTs using amorphous silicon and polycrystalline silicon, etc. in an active layer. Also, further increase in size, finer resolution, higher image quality, and higher drive response are demanded for FPDs. Accordingly, TFTs are demanded to have an excellent carrier mobility, a high on/off ratio, less temporal change of characteristics, and a small variation between elements.

However, amorphous silicon and polycrystal silicon have both advantages and disadvantages so that it is difficult to satisfy all of the requirements. In attempt to meet the demand, TFTs have been actively developed using an oxide semiconductor in an active layer, which is expected to have mobility better than non-crystal silicon.

SUMMARY

According to the present invention, provided is an improved field-effect transistor including a gate electrode to apply a gate voltage, a source electrode and a drain electrode to take electric current out, a semiconductor layer disposed adjacent to the source electrode and the drain electrode, and a gate insulating layer disposed between the gate electrode and the semiconductor layer. The gate insulating layer includes an oxide including silicon and one or two or more alkaline earth metal elements.

BRIEF DESCRIPTION OF THE SEVERAL VIEWS OF THE DRAWINGS

Various other objects, features and attendant advantages of the present invention will be more fully appreciated as the same becomes better understood from the detailed description when considered in connection with the accompanying drawings in which like reference characters designate like corresponding parts throughout and wherein:

FIG. 5 is a schematic diagram illustrating an example of the display element according to an embodiment of the present invention;

FIG. 6 is a schematic diagram illustrating another example of the display element according to an embodiment of the present invention;

Figure 1:
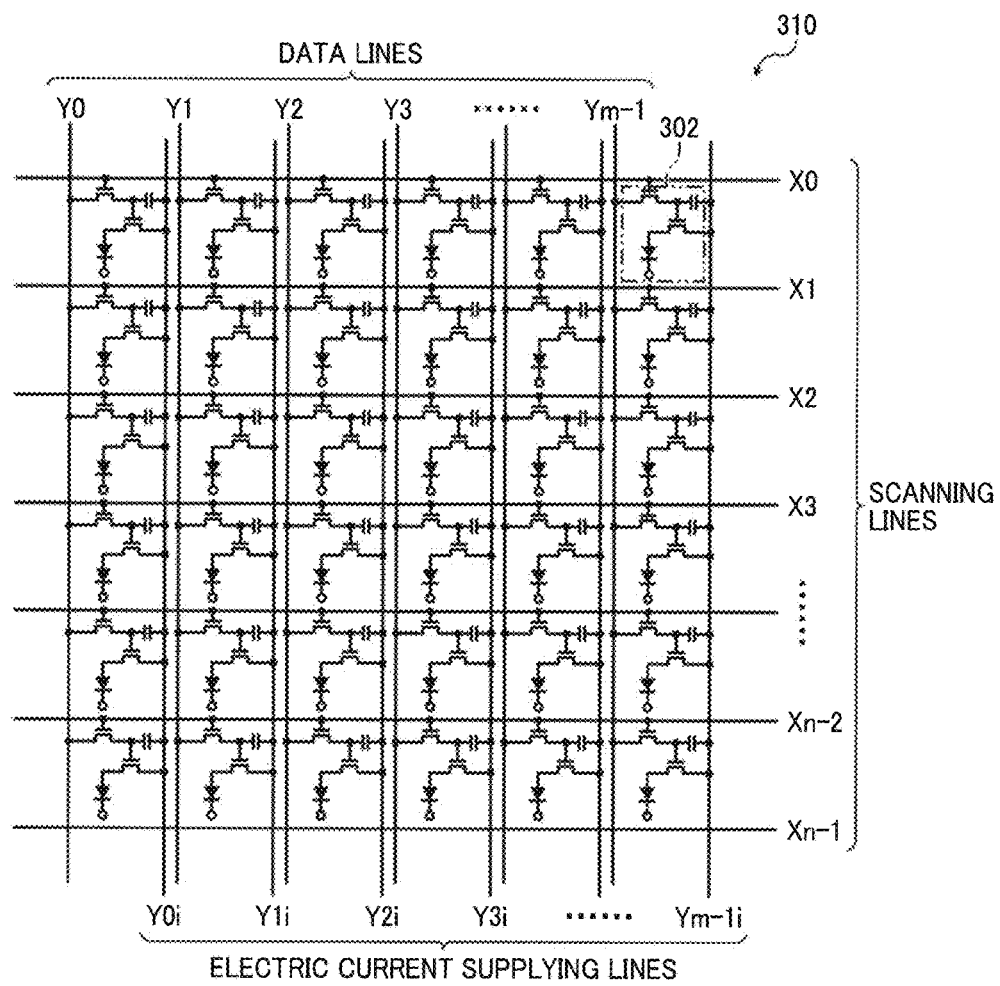
FIG. 1 is a diagram illustrating an image display device.

The accompanying drawings are intended to depict example embodiments of the present invention and should not be interpreted to limit the scope thereof. The accompanying drawings are not to be considered as drawn to scale unless explicitly noted. Also, identical or similar reference numerals designate identical or similar components throughout the several views.

DESCRIPTION OF THE EMBODIMENTS

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

As used herein, the singular forms "a", "an", and "the" are intended to include the plural forms as well, unless the context clearly indicates otherwise.

According to the present disclosure, provided is a field-effect transistor free of peeling-off between the gate electrode, the source electrode and the drain electrode and the gate insulating layer due to heating process.

Field-Effect Transistor

The field-effect transistor of the present disclosure includes a gate electrode, a source electrode, a drain electrode, a semiconductor layer, a gate insulating layer (film), and other optional members.

In the field-effect transistor of the present disclosure, the gate insulating layer includes an oxide including silicon and an alkaline metal, which is described in detail below.

The field-effect transistors disclosed in Japanese Unexamined Published Application Nos. 2013-30784 and 2011-077515 include $SiO_2$ gate insulating layer. $SiO_2$ has a small linear expansion coefficient, which is about $5\times10^{-7}$/K. Therefore, due to the heat process during manufacturing of a field-effect transistor, thermal stress occurs between the materials such as metal and oxide constituting the field-effect transistor and $SiO_2$, which causes peeling-off between the gate insulating layer and the gate electrode, etc.

In addition, Japanese Unexamined Patent Application No. 2012-191008 discloses the thin film transistor, which is not also free of peeling-off even at room temperature depending on the thickness of the gate insulating layer.

As a result of investigations about the gate insulating layer, the present inventors have found that if the gate insulating layer includes an oxide including silicon and one or two or more alkaline metal elements, the linear expansion coefficient of the gate insulating layer increases in comparison with $SiO_2$ so that peeling-off occurring between the gate electrode, the source electrode and the drain electrode and the gate insulating layer, which constitute the field-effect transistor, during heat process can be prevented.

Gate Electrode

The gate electrode is not particularly limited and may be appropriately selected depending on the intended purpose, so long as the gate electrode is an electrode configured to apply gate voltage to the field-effect transistor.

The gate electrode is in contact with the gate insulating layer and faces the semiconductor layer via the gate insulating layer.

A material of the gate electrode is not particularly limited and may be appropriately selected depending on the intended purpose. Examples of the material include: metals (e.g., Mo, Al, Au, Ag, and Cu) and alloys of these metals; transparent conductive oxides, such as indium tin oxide (ITO) and antimony-doped tin oxide (ATO); and organic conductors, such as polyethylene dioxythiophene (PEDOT) and polyaniline (PANI).

Method of Forming Gate Electrode

A formation method of the gate electrode is not particularly limited and may be appropriately selected depending on the intended purpose. Examples of the formation method include: (i) a method of forming a film through sputtering, or dip coating and patterning the film through photolithography; and (ii) a method of directly forming a film having a desired shape through a printing process, such as inkjet printing, nanoimprinting, or gravure printing.

An average film thickness of the gate electrode is not particularly limited and may be appropriately selected depending on the intended purpose. However, the average film thickness of the gate electrode is preferably from 20 nm through 1 µm, more preferably from 50 nm through 300 nm.

Source Electrode and Drain Electrode

The source electrode and the drain electrode are not particularly limited and may be appropriately selected depending on the intended purpose, so long as the source electrode and the drain electrode are electrodes configured to take electric current out from the field-effect transistor.

The source electrode and the drain electrode are formed to be in contact with the gate insulating layer.

A material of the source electrode and the drain electrode is not particularly limited and may be appropriately selected depending on the intended purpose. Examples of the material include: metals (e.g., Mo, Al, Au, Ag, and Cu) and alloys of these metals; transparent conductive oxides, such as indium tin oxide (ITO) and antimony-doped tin oxide (ATO); and organic conductors, such as polyethylene dioxythiophene (PEDOT) and polyaniline (PANI).

Method of Forming Source Electrode and Drain Electrode

The formation method of the source electrode and the drain electrode is not particularly limited and may be appropriately selected depending on the intended purpose. Examples of the formation method include: (i) a method of forming a film through sputtering or dip coating and patterning the film through photolithography; and (ii) a method of directly forming a film having a desired shape through a printing process, such as inkjet printing, nanoimprinting, or gravure printing.

An average film thickness of the source electrode and the drain electrode is not particularly limited and may be appropriately selected depending on the intended purpose. However, the average film thickness is preferably from 20 nm through 1 µm, more preferably from 50 nm through 300 nm.

Semiconductor Layer

The semiconductor layer is formed at least between the source electrode and the drain electrode.

Here, the "between" means a position at which the semiconductor layer allows the field-effect transistor to function together with the source electrode and the drain electrode. The position of the semiconductor layer is not particularly limited and may be appropriately selected depending on the intended purpose, so long as the position is the above-described position.

The semiconductor layer is in contact with the gate insulating layer, the source electrode, and the drain electrode.

A material of the semiconductor layer is not particularly limited and may be appropriately selected depending on the intended purpose. Examples of the material include silicon semiconductors and oxide semiconductors.

Examples of the silicon conductors include amorphous silicon and polycrystalline silicon.

Examples of the oxide semiconductors include InGa—Zn—O, In—Zn—O, and In—Mg—O.

Of these examples, oxide semiconductors are preferable.

Method of Forming Semiconductor Layer

A formation method of the semiconductor layer is not particularly limited and may be appropriately selected depending on the intended purpose. Examples of the formation method include: a method of forming a film through a vacuum process (e.g., sputtering, pulsed laser deposition (PLD), chemical vapor deposition (CVD), or atomic layer deposition (ALD)) or a solution process (e.g., dip coating, spin coating, or die coating) and patterning the film through photolithography; and a method of directly forming a film having a desired shape through a printing method, such as inkjet printing, nanoimprinting, or gravure printing.

An average film thickness of the semiconductor layer is not particularly limited and may be appropriately selected depending on the intended purpose. However, the average film thickness of the semiconductor layer is preferably from 5 nm through 1 μm, more preferably from 10 nm through 0.5 μm.

Gate Insulating Layer

The gate insulating layer is normally disposed between the gate electrode and the semiconductor layer.

The gate insulating layer includes an oxide.

Oxide

The oxide includes at least Si (silicon) and one or two or more alkaline earth metal elements, preferably includes at least one of Al (aluminum) and B (boron), and further includes other components according to the necessity.

In the oxide, $SiO_2$ formed with the aforementioned Si takes an amorphous structure. Moreover, the alkaline earth metal has a function of cleaving Si—O bond. Therefore, the relative permittivity and linear expansion coefficient of the oxide to be formed can be controlled with a composition ratio of the Si and the alkaline earth metal.

The oxide preferably contains Al, or B, or both. $Al_2O_3$ formed with the Al, and $B_2O_3$ formed with the B each form an amorphous structure, similarly to $SiO_2$. Therefore, an amorphous structure is more stably formed in the oxide, and it is possible to form a more uniform insulating film. Since the alkaline earth metal changes the coordinate structure of Al and B depending on the composition ratio therefore, a relative permittivity and linear expansion coefficient of the oxide can be controlled.

Examples of the alkaline earth metal in the oxide include Be (beryllium), Mg (magnesium), Ca (calcium), Sr (strontium), and Ba (barium). They may be used alone, or in combination.

A composition ratio of the Si and the alkaline earth metal in the oxide is appropriately selected depending on the intended purpose without any limitation, but the composition ratio thereof is preferably within the following range.

In the oxide, the composition ratio of the Si and the alkaline earth metal (the Si:the alkaline earth metal) is preferably 50.0 mol % to 90.0 mol %:10.0 mol % to 50.0 mol %, based on the oxide ($SiO_2$, BeO, MgO, CaO, SrO, BaO) conversion.

A composition ratio of the Si, the alkaline earth metal, and the Al and/or the B in the oxide is appropriately selected depending on the intended purpose without any limitation, but the composition ratio thereof is preferably within the following range.

In the oxide, the composition ratio of the Si, the alkaline earth metal, and the Al and/or the B (the Si:the alkaline earth metal:the Al and/or the B) is preferably 50.0 mol % to 90.0 mol %:5.0 mol % to 20.0 mol %:5.0 mol % to 30.0 mol %, based on the oxide ($SiO_2$, BeO, MgO, CaO, SrO, BaO, $Al_2O_3$, $B_2O_3$) conversion.

The ratio of the oxides ($SiO_2$, BeO, MgO, CaO, SrO, BaO, $Al_2O_3$, and $B_2O_3$) in the oxide can be calculated by, for example, analyzing cationic elements of the oxide by fluorescent X-ray spectroscopy, electron-probe microanalysis (EPMA), inductively coupled plasma atomic emission spectroscopy (ICP-AES), etc.

The linear expansion coefficient of the gate insulating layer is appropriately selected depending on the intended purpose without any limitation. However, in terms of preventing peeling-off between the gate electrode, the source electrode, and the drain electrode and the gate insulating layer, the composition ratio thereof is preferably within the following range.

The linear expansion coefficient of the gate insulating layer is preferably $20.0 \times 10^{-7}$/K or greater, and more preferably $20.0 \times 10^{-7}$-$70.0 \times 10^{-7}$/K.

The linear expansion coefficient can be measured by using, for example, a thermomechanical analyzer. In this measurement, the linear expansion coefficient can be measured by separately producing a measurement sample having the same composition to that of the gate insulating layer, without producing the field-effect transistor.

The relative permittivity of the gate insulating layer is appropriately selected depending on the intended purpose without any limitation.

The relative permittivity can be measured by, for example, manufacturing and measuring a capacitor having a laminate structure of a bottom electrode, a dielectric layer (the gate insulating layer) and a top electrode with an LCR meter, etc.

Method of Forming Gate Insulating Layer

A formation method of the gate insulating layer is not particularly limited and may be appropriately selected depending on the intended purpose. Examples of the formation method include a method of forming a film by a vacuum process, such as sputtering, pulsed laser deposition (PLD), chemical vapor deposition (CVD), or atomic layer deposition (ALD) and patterning the film through photolithography.

Moreover, the gate insulating layer can be formed by preparing a coating liquid containing a precursor of the oxide (a gate-insulating-layer-coating liquid), coating or printing the coating liquid onto an object to be coated, and baking the resultant under appropriate conditions.

An average film thickness of the gate insulating layer is preferably from 10 nm through 1,000 nm, more preferably from 20 nm through 500 nm.

Gate-Insulating-Layer-Coating Liquid

The gate-insulating-layer-coating liquid contains at least silicon-containing compound, an alkaline-earth-element-containing compound, and a solvent, preferably contains at least one of an aluminum-containing compound and a boron-containing compound, and further contains other components according to the necessity.

Silicon-Containing Compound

Examples of the silicon-containing compound include an inorganic silicon compound, and an organic silicon compound.

Examples of the inorganic silicon compound include, but are not limited to, tetrachlorosilane, tetrabromosilane, and tetraiodesilane.

The organic silicon compound is appropriately selected depending on the intended purpose without any limitation, provided that it is a compound containing silicon and an organic group. The silicon and the organic group are bonded by, for example, ion bond, covalent bond, or coordinate bond.

The organic group is not particularly limited and may be appropriately selected depending on the intended purpose. For example, substituted or non-substituted alkyl groups, substituted or non-substituted alkoxy groups, substituted or non-substituted acyloxy groups, and substituted or non-substituted phenyl groups are preferable. Examples of the alkyl group include, but are not limited to, alkyl groups having one to six carbon atoms.

Examples of the alkoxy group include, but are not limited to, alkoxy groups having one to six carbon atoms.

Examples of the acyloxy group include, but are not limited to, acyloxy groups having one to ten carbon atoms.

Examples of the organic silicon compounds include, but are not limited to, tetramethoxy silane, tetraethoxy silane, tetraisopropoxy silane, tetrabutoxysilane, 1,1,1,3,3,3-hexamethyl disilazane (HMDS), bis(trimethyl silyl)acetylene, triphenyl silane, silicon 2-ethylhexanoate, and tetraacetoxy silane.

An amount of the silicon-containing compound in the gate insulating layer coating liquid is appropriately selected depending on the intended purpose without any limitation.

Alkaline-Earth-Metal-Containing Compound

Examples of the alkaline-earth-metal-containing compound include inorganic alkaline earth metal compounds and organic alkaline earth metal compounds. Examples of alkaline earth metals in the alkaline-earth-metal-containing compound include Be (beryllium), Mg (magnesium), Ca (calcium), Sr (strontium), and Ba (barium).

Examples of the inorganic alkaline earth metal compounds include alkaline earth metal nitrate, alkaline earth metal sulfate, alkaline earth metal chlorides, alkaline earth metal fluorides, alkaline earth metal bromides, and alkaline earth metal iodides.

Examples of the alkaline earth metal nitrate include magnesium nitrate, calcium nitrate, strontium nitrate, and barium nitrate.

Examples of the alkaline earth metal sulfate include magnesium sulfate, calcium sulfate, strontium sulfate, and barium sulfate.

Examples of the alkaline earth metal chlorides include magnesium chloride, calcium chloride, strontium chloride, and barium chloride.

Examples of the alkaline earth metal fluorides include magnesium fluoride, calcium fluoride, strontium fluoride, and barium fluoride.

Examples of the alkaline earth metal bromides include magnesium bromide, calcium bromide, strontium bromide, and barium bromide.

Examples of the alkaline earth metal iodides include magnesium iodide, calcium iodide, strontium iodide, and barium iodide.

The organic alkaline earth metal compounds are not particularly limited and may be appropriately selected depending on the intended purpose, so long as the organic alkaline earth metal compounds are each a compound containing an alkaline earth metal and an organic group. The alkaline earth metal and the organic group are bonded by, for example, ion bond, covalent bond, or coordinate bond.

The organic group is not particularly limited and may be appropriately selected depending on the intended purpose. For example, substituted or non-substituted alkyl groups, substituted or non-substituted alkoxy groups, substituted or non-substituted acyloxy groups, substituted or non-substituted phenyl groups, substituted or non-substituted acetylacetonate groups, and substituted or non-substituted sulfonic acid groups are preferable.

Examples of the alkyl group include, but are not limited to, alkyl groups having one to six carbon atoms.

Examples of the alkoxy group include, but are not limited to, alkoxy groups having one to six carbon atoms.

Examples of acyloxy group include, but are not limited to, acyloxyl groups having one to ten carbon atoms, acyloxyl groups partially substituted with a benzene ring such as acetic benzoic acid, acyloxyl groups partially substituted with a hydroxy group such as lactic acid, and acyloxyl groups having two or more carbonyl groups such as oxalic acid and citric acid.

Examples of the organic alkaline earth metal include, but are not limited to, magnesium methoxide, magnesium ethoxide, diethyl magnesium, magnesium acetate, magnesium formate, magnesium acetylacetonate, magnesium 2-ethylhexanoate, magnesium lactate, magnesium naphthenate, magnesium citrate, magnesium salicylate, magnesium benzoate, magnesium oxalate, magnesium trifluoromethane-sulfonate, calcium methoxide, calcium ethoxide, calcium acetate, calcium formate, calcium acetylacetonate, calcium dipivaloyl methanate, calcium 2-ethylhexanoate, calcium lactate, calcium naphthenate, calcium citrate, calcium salicylate, calcium neodecanoate, calcium benzoate, calcium oxalate, strontium isopropoxide, strontium acetate, strontium formate, strontium acetylacetonate, strontium 2-ethylhexanoate, strontium lactate, strontium naphthenate, strontium salicylate, strontium oxalate, barium ethoxide, barium isopropoxide, barium acetate, barium formate, barium acetylacetonate, barium 2-ethylhexanoate, barium lactate, barium naphthenate, barium naphtate, barium neodecanoate, barium oxalate, barium benzoate, and barium trifluoromethane-sulfonate.

An amount of the alkaline earth metal-containing compound in the gate insulator layer coating liquid is appropriately selected depending on the intended purpose without any limitation.

Aluminum-Containing Compound

Examples of the aluminum-containing compound are inorganic aluminum compounds and organic aluminum compounds.

Examples of the inorganic aluminum compound include aluminum chloride, aluminum nitrate, aluminum bromide, aluminum hydroxide, aluminum borate, aluminum trifluoride, aluminum iodide, aluminum sulfate, aluminum phosphate, and ammonium aluminum sulfate.

The organic aluminum compound is appropriately selected depending on the intended purpose without any limitation, provided that it is a compound containing aluminum and an organic group. The aluminum and the organic group are bonded, for example, with an ionic bond, a covalent bond, or a coordinate bond.

The organic group is appropriately selected depending on the intended purpose without any limitation. For example, substituted or non-substituted alkyl groups, substituted or non-substituted alkoxy groups, substituted or non-substituted acyloxy groups, substituted or non-substituted acetylacetonate groups, and substituted or non-substituted sulfonic acid groups are preferable.

Examples of the alkyl group include, but are not limited to, alkyl groups having one to six carbon atoms.

Examples of the alkoxy group include, but are not limited to, alkoxy groups having one to six carbon atoms.

Examples of acyloxy group include, but are not limited to, acyloxyl groups having one to ten carbon atoms, acyloxyl groups partially substituted with a benzene ring such as acetic benzoic acid, acyloxyl groups partially substituted with a hydroxy group such as lactic acid, and acyloxyl groups having two or more carbonyl groups such as oxalic acid and citric acid.

Examples of the organic aluminum compound include aluminum isopropoxide, aluminum-sec-butoxide, triethyl aluminum, diethyl aluminum ethoxide, aluminum acetate, aluminum acetylacetonate, aluminum hexafluoroacetylacetonate, aluminum 2-ethylhexanoate, aluminum lactate, aluminum benzoate, aluminum di(s-butoxide) acetoacetate chelate, and aluminum trifluromethane-sulfonate.

An amount of the aluminum-containing compound in the gate insulating layer coating liquid is appropriately selected depending on the intended purpose without any limitation.

Boron-Containing Compound

Examples of the boron containing compound are inorganic boron compounds and organic boron compounds.

Examples of the inorganic boron compound include orthoboric acid, boron oxide, boron tribromide, tetrafluoroboric acid, ammonium borate, and magnesium borate. Examples of the boron oxide include diboron dioxide, diboron trioxide, tetraboron trioxide, and tetraboron pentaoxide.

The organic boron compound is appropriately selected depending on the intended purpose without any limitation, provided that it is a compound containing boron and an organic group.

Boron and the organic group are bonded by, for example, ion bond, covalent bond, or coordinate bond.

The organic group is appropriately selected depending on the intended purpose without any limitation. For example, substituted or non-substituted alkyl groups, substituted or non-substituted alkoxy groups, substituted or non-substituted acyloxy groups, substituted or non-substituted phenyl groups, substituted or non-substituted sulfonic acid groups, and substituted or non-substituted thiophene groups are preferable.

Examples of the alkyl group include, but are not limited to, alkyl groups having one to six carbon atoms.

Examples of the alkoxy group include, but are not limited to, alkoxy groups having one to six carbon atoms.

The alkoxy group includes an organic group having two or more oxygen atoms and two of the two or more oxygen atoms bond with boron, which forms a ring structure. In addition, the alkoxy group includes the case in which the alkyl group included in the alkoxy group is substituted with an organic silyl group. Examples of the acyloxy group include, but are not limited to, acyloxy groups having one to ten carbon atoms.

Examples of the organic boron compound include (R)-5,5-diphenyl-2-methyl-3,4-propano-1,3,2-oxaborolidine, triisopropyl borate, 2-isopropoxy-4,4,5,5-tetramethyl-1,3,2-dioxaborolane, bis(hexyleneglycolato)diboron, 4-(4,4,5,5-tetramethyl-1,3,2-dioxaborolan-2-yl)-1H-pyrazole, (4,4,5,5-tetramethyl-1,3,2-dioxaborolan-2-yl)benzene, tert-butyl-N-[4-(4,4,5,5-tetramethyl-1,2,3-dioxaborolan-2-yl)phenyl] carbamate, phenylboronic acid, 3-acetylphenylboronic acid, a boron trifluoride acetic acid complex, a boron trifluoride sulfolane complex, 2-thiopheneboronic acid, and tris(trimethylsilyl)botate.

An amount of the boron-containing compound in the gate insulating layer coating liquid is appropriately selected depending on the intended purpose without any limitation.

Solvent

The solvent is appropriately selected depending on the intended purpose without any limitation, provided that it is a solvent capable of stably dissolving or dispersing the aforementioned various compounds.

Specific examples include, but are not limited to, toluene, xylene, mesitylene, cymene, pentylbenzene, dodecylbenzene, bicyclohexyl, cyclohexylbenzene, decane, undecane, dodecane, tridecane, tetradecane, pentadecane, tetralin, decalin, isopropanol, ethyl benzoate, N,N-dimethylformamide, proopylene carbonate, 2-ethyl hexanic acid, mineral spirits, dimethyl propylene urea, 4-butylolactone, 2-methoxyethanol, and water.

An amount of the solvent in the gate insulating layer coating liquid is appropriately selected depending on the intended purpose without any limitation.

A composition ratio of the silicon-containing compound and the alkaline earth metal-containing compound (the silicon-containing compound:the alkaline earth metal-containing compound) in the gate insulating layer coating liquid is appropriately selected depending on the intended purpose without any limitation, but the composition ratio thereof is preferably within the following range.

In the gate insulating layer coating liquid, the composition ratio of the Si and the alkaline earth metal (the Si:the alkaline earth metal) is preferably 50.0 mol % to 90.0 mol %:10.0 mol % to 50.0 mol %, based on the oxide ($SiO_2$, BeO, MgO, CaO, SrO, BaO) conversion.

A composition ratio of the silicon-containing compound, the alkaline earth metal-containing compound, and the aluminum-containing compound and/or the boron-containing compound (the silicon-containing compound:the alkaline earth metal-containing compound:the aluminum-containing compound and/or the boron-containing compound) in the gate insulating layer coating liquid is appropriately selected depending on the intended purpose without any limitation, but the composition ratio thereof is preferably within the following range.

In the gate insulating layer coating liquid, the composition ratio of the Si, the alkaline earth metal, and the Al and/or the B (the Si:the alkaline earth metal:the Al and/or the B) is preferably 50.0 mol % to 90.0 mol %:5.0 mol % to 20.0 mol %:5.0 mol % to 30.0 mol %, based on the oxide ($SiO_2$, BeO, MgO, CaO, SrO, BaO, $Al_2O_3$, $B_2O_3$) conversion.

Formation Method of Gate Insulating Layer Using Gate-Insulating-Layer Coating Liquid One example of a formation method of the gate insulating layer using the gate-insulating-layer-coating liquid will be described. The formation method of the gate insulating layer contains a coating step and a heat treatment step and further contains other steps according to the necessity.

The coating step is not particularly limited and may be appropriately selected depending on the intended purpose, so long as the coating step is a step of coating the gate-insulating-layer-coating liquid onto an object to be coated. A method of the coating is not particularly limited and may be appropriately selected depending on the intended purpose. Examples of the method include: a method of forming a film through a solution process and patterning the film through photolithography; and a method of directly forming a film having a desired shape by printing, such as inkjet printing, nanoimprinting, or gravure printing. Examples of the solution process include dip coating, spin coating, die coating, and nozzle printing.

The heat treatment step is not particularly limited and may be appropriately selected depending on the intended purpose, so long as the heat treatment step is a step of heat-treating the gate-insulating-layer-coating liquid coated on the object to be coated. Note that, in the heat treatment step, the gate-insulating-layer-coating liquid coated on the object to be coated may be dried through air drying. As a result of the heat treatment, the solvent is evaporated and the oxide is generated.

In the heat treatment step, evaporation of the solvent (hereinafter referred to as "evaporation treatment") and generation of the oxide (hereinafter referred to as "generation treatment") are preferably performed at different temperatures. Specifically, it is preferable that after the evaporation of the solvent, the temperature be elevated to generate the oxide. At the time of generation of the oxide, for example, at least one of the silicon-containing compound, alkaline-earth-metal-containing compound, the aluminum-containing compound, and the boron-containing compound is decomposed.

A temperature of the evaporation treatment is not particularly limited and may be appropriately selected depending on the solvent contained. For example, the temperature of the evaporation treatment is from 80° C. through 180° C. As for the evaporation, it is effective to use a vacuum oven for reducing the required temperature. The time of the evaporation treatment is not particularly limited and may be appropriately selected depending on the intended purpose. For example, the time of the evaporation treatment is from 10 minutes through 1 hour.

A temperature of the generation treatment is not particularly limited and may be appropriately selected depending on the intended purpose. However, the temperature of the generation treatment is preferably 100° C. or higher but lower than 550° C., more preferably from 200° C. through 500° C. The time of the generation treatment is not particularly limited and may be appropriately selected depending on the intended purpose. For example, the time of the generation treatment is from 1 hour through 5 hours.

Note that, in the heat treatment step, the evaporation treatment and the generation treatment may be continuously performed or may be performed in a divided manner of a plurality of step.

A method of the heat treatment is not particularly limited and may be appropriately selected depending on the intended purpose. Examples of the method of the heat treatment include a method of heating the object to be coated. An atmosphere in the heat treatment is not particularly limited and may be appropriately selected depending on the intended purpose. However, the atmosphere is preferably an oxygen atmosphere. When the heat treatment is performed in the oxygen atmosphere, decomposed products can be promptly discharged to the outside of the system and generation of the first complex oxide can be accelerated.

In the heat treatment, in view of acceleration of reaction of the generation treatment, it is effective to apply ultraviolet rays having a wavelength of 400 nm or shorter to the material after the evaporation treatment. Applying the ultraviolet rays having a wavelength of 400 nm or shorter can cleave chemical bonds of the organic material contained in the material after the evaporation treatment and can decompose the organic material. Therefore, the first complex oxide can be efficiently formed. The ultraviolet rays having a wavelength of 400 nm or shorter are not particularly limited and may be appropriately selected depending on the intended purpose. Examples of the ultraviolet rays include ultraviolet rays having a wavelength of 222 nm emitted from an excimer lamp. It is also preferable to apply ozone instead of or in combination with the ultraviolet rays. Applying the ozone to the material after the evaporation treatment accelerates generation of the oxide.

A structure of the field-effect transistor is not particularly limited and may be appropriately selected depending on the intended purpose. Examples of the structure of the field-effect transistor include the following structures.

1. A field-effect transistor including a substrate, the gate electrode formed on the substrate, the gate insulating layer formed on the gate electrode, the source electrode and the drain electrode formed on the gate insulating layer, and the semiconductor layer formed between the source electrode and the drain electrode.

2. A field-effect transistor including a substrate, the source electrode and the drain electrode formed on the substrate, the semiconductor layer formed between the source electrode and the drain electrode, the gate insulating layer formed on the source electrode, the drain electrode, and the semiconductor layer, and the gate electrode formed on the gate insulating layer.

Figure 3A:
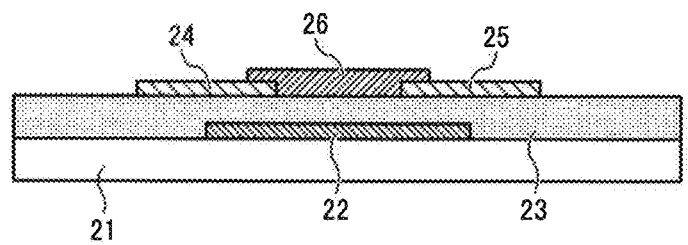
FIG. 3A is a diagram illustrating an example (bottom contact•bottom gate type) of the field-effect transistor according to an embodiment of the present invention.
Figure 3B:
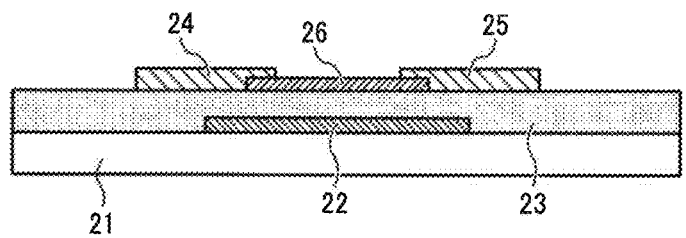
FIG. 3B is a diagram illustrating an example (top contact•bottom gate type) of the field-effect transistor according to an embodiment of the present invention.

As the field-effect transistor having the structure of 1 mentioned above, for example, there are a bottom contact•bottom gate type (refer to FIG. 3A) and a top contact•bottom gate (refer to FIG. 3B).

Figure 3C:
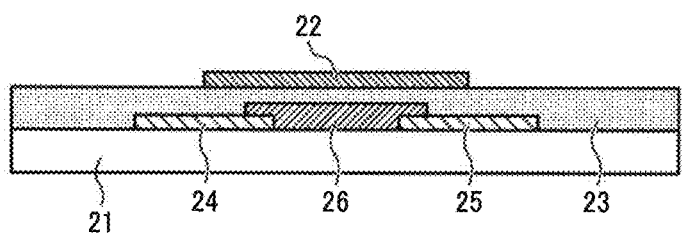
FIG. 3C is a diagram illustrating an example (bottom contact•top gate type) of the field-effect transistor according to an embodiment of the present invention.
Figure 3D:
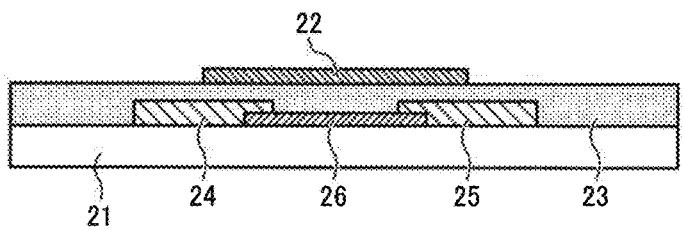
FIG. 3D is a diagram illustrating an example (top contact•top gate type) of the field-effect transistor according to an embodiment of the present invention.

As the field-effect transistor having the structure of 2 mentioned above, for example, there are a bottom contact•top gate type (refer to FIG. 3C) and a top contact•top gate (refer to FIG. 3D).

In FIGS. 3A to 3D, each field-effect transistor includes a substrate 21, a gate electrode 22, a gate insulating layer 23, a source electrode 24, a drain electrode 25, and an oxide semiconductor layer. 26. The oxide semiconductor layer 26 may be replaced with, for example, a silicon semiconductor layer as described above.

The field-effect transistor can be suitably applied to display elements, which are described later but is not limited thereto. For example, the field-effect transistor can be applied to IC cards, ID tags, etc.

Display Element

A display element of the present disclosure contains at least a light control element and a driving circuit configured to drive the light control element and further contains other members according to the necessity.

Light Control Element

The light control element is not particularly limited and may be appropriately selected depending on the intended purpose, so long as the light control element is an element configured to control light output according to a driving signal. Examples of the light control element include electroluminescent (EL) elements, electrochromic (EC) elements, liquid crystal elements, electrophoretic elements, and electrowetting elements.

Driving Circuit

The driving circuit is not particularly limited and may be appropriately selected depending on the intended purpose, so long as the driving circuit is a circuit containing the field-effect transistor of the present disclosure and configured to drive the light control element.

Other Members

There is no specific limitation to the other members and it can be suitably selected to suit to a particular application.

Since the display element has the field-effect transistor of the present disclosure, long service life and high-speed operation are possible.

Image Display Device

The image display device of the present disclosure includes at least multiple display elements, multiple wired lines, and a display control device. The image display device may further include other optional members.

The image display device is a device configured to display an image corresponding to image data.

Display Element

The display element has no specific limitation and can be suitably selected to suit to a particular application as long as the display element of the present disclosure arranged in matrix is used.

Wires

The wired lines have no particular limit and can be selected to suit to a particular application as long as the wiring is set to individually apply a gate voltage to each field-effect transistor in the display element.

Display Control Device

The display control device has no particular limit and can be selected to suit to a particular application as long as the display c display control device controls the individual gate voltages of each field-effect transistor via the multiple wirings according to the image data.

Other Members

There is no specific limitation to the other members and it can be suitably selected to suit to a particular application.

Since the image display device has the field-effect transistor of the present disclosure, long service time and high-speed operation are possible.

The image display device can be applied to portable information devices such as mobile phones, portable audio players, portable video players, electronic books, personal digital assistant (PDA), and imaging devices such as still cameras and video cameras. In addition, the image display can be used for displays of various information in the mobile system of vehicles, air planes, trains, ships, etc. Moreover, it is possible to apply the image display device to displays for various information in measuring systems, analyzing devices, medical equipment, and advertising media.

System

The system of the present disclosure includes the image display device of the present disclosure and an image-data-generating device.

The image-data-generating device generates image data based on image information to be displayed and outputs the image data to the image display device.

The display element, the image display device, and the system of the present disclosure are described with reference to drawings.

As an embodiment of the system of the present disclosure, television sets are described.

The television set as an embodiment of the system of the present disclosure employs a configuration described in the paragraphs of [0038]-[0058] and illustrated in FIG. 1 disclosed in Japanese Unexamined Patent Application Publication No. 2010-074148.

Next, the image display device of the present disclosure is described.

Figure 2:
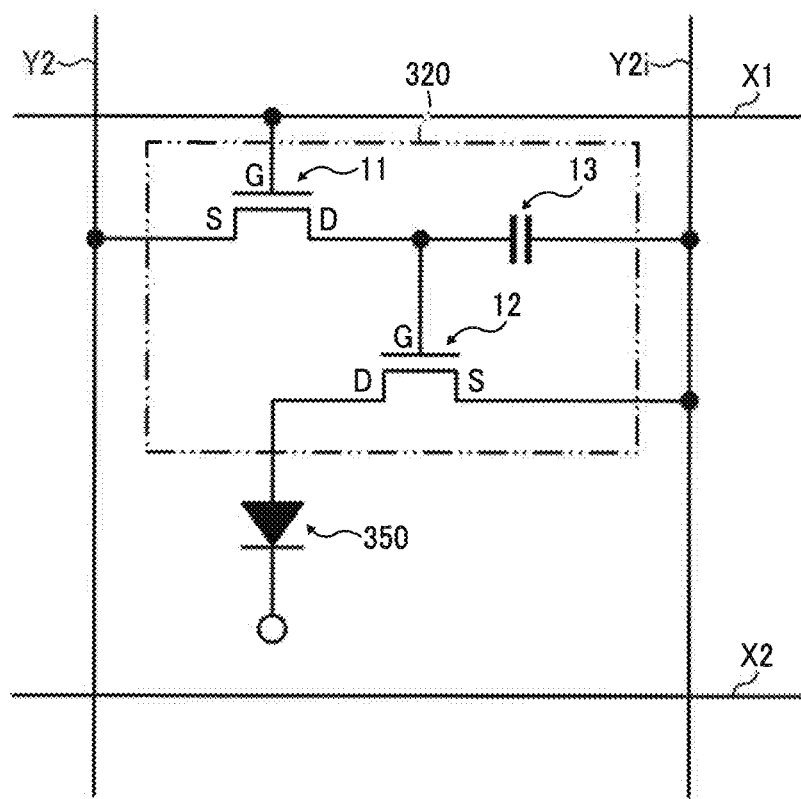
FIG. 2 is a diagram illustrating a description of an example of the display element according to an embodiment of the present invention.

The image display device of the present disclosure employs a configuration described in the paragraphs of [0059] and [0060] and illustrated in FIGS. 2 and 3 disclosed in Japanese Unexamined Patent Application Publication No. 2010-074148.

The display element of the present disclosure is described with reference to the accompanying drawings.

FIG. 1 is a diagram illustrating a display 310 in which display elements are arranged in matrix.

As illustrated in FIG. 1, the display 310 includes the number of n-scanning lines (X0, X1, X2, X3, . . . , Xn-2, Xn-1) disposed along the X axis spaced an equal gap therebetween, and the number of m data lines (Y0, Y1, Y2, Y3, . . . , Ym-2, Ym-1) disposed along the Y axis spaced an equal gap therebetween, and the number of m-electric current supplying lines (Y0i, Y1i, Y2i, Y3i, . . . , Ym-1i) disposed along the Y axis spaced an equal gap therebetween.

Accordingly, the display element can be identified by the scanning lines and the data lines.

FIG. 2 is a schematic diagram illustrating an example of the display element of the present disclosure.

As illustrated in FIG. 2, the display element includes an organic electroluminescent (EL) element 350 and a driving circuit 320 to make the organic EL element 350 emit light. That is, the display 310 is an organic EL display employing so-called active matrix system. In addition, the display 310 is 32-inch display supporting color. However, the size is not limited thereto.

The driving circuit 320 illustrated in FIG. 2 is described.

The driving circuit 320 includes two field-effect transistors 11 and 12 and a capacitor 13.

The field-effect transistor 11 operates as a switching element. The gate electrode G is connected to a predetermined scanning line and the source electrode S is connected to a predetermined data line. In addition, the drain electrode D is connected to one terminal of the capacitor 13.

The capacitor 13 stores the state, i.e., data, of the field-effect transistor 11. The other terminal of the capacitor 13 is connected to a predetermined electric current supplying line.

The field-effect transistor 12 supplies a large electric current to the organic EL element 350. The gate electrode G is connected to the drain electrode D of the field-effect transistor 11. The drain electrode D is connected to the anode of the organic EL element 350 and the source electrode S is connected to a predetermined electric current supplying line.

When the field-effect transistor 11 is switched on, the field-effect transistor 12 drives the organic EL element 350.

As illustrated in FIG. 3A, each of the field-effect transistors 11 and 12 includes, for example, a substrate 21, a gate electrode 22, a gate insulating layer 23, a source electrode 24, a drain electrode 25, and an oxide semiconductor layer 26.

The field-effect transistors 11 and 12 can be formed of the materials and processes mentioned in the description of the field-effect transistor of the present disclosure.

Figure 4:
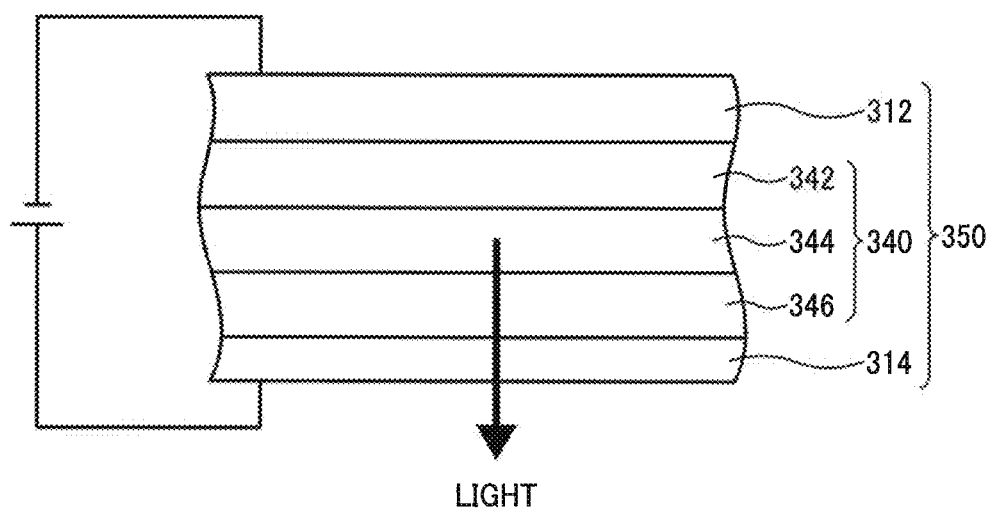
FIG. 4 is a schematic diagram illustrating an example of an organic electroluminescence (EL) element.

FIG. 4 is a schematic diagram illustrating an example of an organic EL element.

In FIG. 4, the organic EL element 350 includes a cathode 312, an anode 314, and an organic EL thin film layer 340.

The material of the cathode 312 has no specific limitation and can be suitably selected to suit to a particular application. For example, aluminum (AL), alloys of magnesium (MG) and silver (Ag), alloys of aluminum (Al)-lithium (Li), and indium tin oxide (ITO) are preferable. Alloys of magnesium (MG) and silver (Ag) having a sufficient thickness become a high-reflection-ratio electrode and alloys of magnesium (MG) and silver (Ag) having an extremely thin thickness (about 20 nm) become a semi-transparent electrode. In FIG. 4, light is taken out from the anode side. However, it is possible to take out light from the cathode by making the cathode transparent or semi-transparent.

The material of the positive electrode 314 has no specific limitation and can be suitably selected to suit to a particular application. For example, indium tin oxide (ITO), indium zinc oxide (IZO), and alloys of silver (Ag) and neodymium (Nd) are suitable. If alloys of silver are used, high-reflection-ratio electrodes are obtained, which is suitable to take out light from the negative electrode side.

The organic EL thin film layer 340 includes an electron transporting layer 342, a light emitting layer 344, and a hole transporting layer 346. The electron transporting layer 342 is connected to the cathode 312 and the hole transporting layer 346 is connected to the anode 314. If a predetermined voltage is applied to between the anode 314 and the cathode 312, the light emitting layer 344 emits light.

It is preferable to form a single layer by the electron transporting layer 342 and the light emitting layer 344. Moreover, it is also preferable to provide an electron injecting layer between the electron transporting layer 342 and the cathode 312. Furthermore, it is preferable to provide a hole injecting layer between the hole transporting layer 346 and the anode 314.

In FIG. 4, as the light control element, the case of an organic EL element of so-called "bottom emission" in which light is taken out from the substrate side is described. The light control element may be an organic EL element of "top emission" in which light is taken out from the opposite side of the substrate.

FIG. 5 is a diagram illustrating an example of the display element in which the organic EL element 350 and the driving circuit 320 are combined.

The display element includes a substrate 31, a first electrode 32, a second gate electrode 33, a gate insulating layer 34, a first source electrode 35 and a second source electrode 36, a first drain electrode 37 and a second drain electrode 38, a first oxide semiconductor layer 39 and a second oxide semiconductor layer 40, a first passivation layer 41 and a second passivation layer 42, an interlayer insulating layer 43 between layers, an organic EL layer 44, and a cathode 45. The first drain electrode 37 and the second gate electrode 33 are connected to each other via a through hole formed in the gate insulating layer 34. The first oxide semiconductor layer 39 and the second oxide semiconductor layer 40 may be replaced with, for example, a silicon semiconductor layer as described above.

In FIG. 5, a capacitor seems to be formed between the second gate electrode 33 and the second drain electrode 38 for convenience sake. However, the actual position of the capacitor is not limited and a capacitor having a required capacity can be suitably designed at a necessary position.

In addition, in the display element illustrated in FIG. 5, the second drain electrode 38 operates as the anode in the organic EL element 350.

The substrate 31, the first gate electrode 32 and the second gate electrode 33, the gate insulating layer 34, the first source electrode 35, the second source electrode 36, the first drain electrode 37, the second drain electrode 38, the first oxide semiconductor layer 39, the second oxide semiconductor layer 40 can be formed of the materials and processes mentioned in the description of the field-effect transistor of the present disclosure.

The gate insulating layer 34 corresponds to the gate insulating layer of the field-effect transistor of the present disclosure.

The material of the interlayer insulating layer (planarization layer) 43 has no specific limit and can be suitably selected to suit to a particular application. For example, organic materials, inorganic materials, and complex materials of inorganic materials and organic materials are preferable.

Examples of the organic materials include resins such as polyimides, acrylic resins, fluororesins, non-fluororesins, olefin resins, silicone resins, and photosensitive resins using these resins.

A specific example of the inorganic material is a spin on glass (SOG) materials such as AQUAMICA™ (manufactured by AZ Electronic Materials plc).

As the complex materials of inorganic materials and organic materials, for example, complex materials of inorganic materials and organic materials formed of silane compounds (disclosed in Japanese Unexamined Patent Application Publication No. 2007-158146). The interlayer insulating layer preferably has barrier properties against moisture, oxygen, and hydrogen contained in atmosphere.

The forming process of the interlayer insulating layer has no particular limit and can be suitably selected to suit to a particular application. For example, it is preferable to directly form a film having a desired form by a method such as spin coating, inkjet printing, slit coating, nozzle printing, gravure printing, and dip coating method or conduct patterning by photolithography method in the case of a photosensitive material.

After forming the interlayer insulating layer, the interlayer insulating layer is subject to heat treatment as post-processing, which is preferable to stabilize characteristics of a field-effect transistor constituting a display element.

The method of manufacturing the organic EL layer 44 and the cathode 45 has no particular limit and can be suitably selected to suit to a particular application. For example, vacuum film-forming methods such as vacuum deposition methods and sputtering methods and solution processes such as inkjet and nozzle coating are preferable.

As a result, a display element operating as the organic EL element employing so-called "bottom emission" in which light is taken out from the substrate side can be manufactured. In this case, the substrate 31, the gate insulating layer 34, and the second drain electrode (anode) 38 are required to be transparent.

Furthermore, the configuration illustrated in FIG. 5 has the organic EL element 350 disposed aside the driving circuit 320. However, as illustrated in FIG. 6, the organic EL element 250 may be disposed on or above the driving circuit 320. Also, this configuration employs "bottom emission" taking out light from the substrate side so that the driving circuit 320 is required to be transparent. It is preferable to use conductive transparent oxides such as ITO, $In_2O_3$, $SnO_2$, ZnO, Ga-doped ZnO, Al-doped ZnO, and Sb-doped $SnO_2$ for the source electrode, the drain electrode, and the anode.

Figure 7:
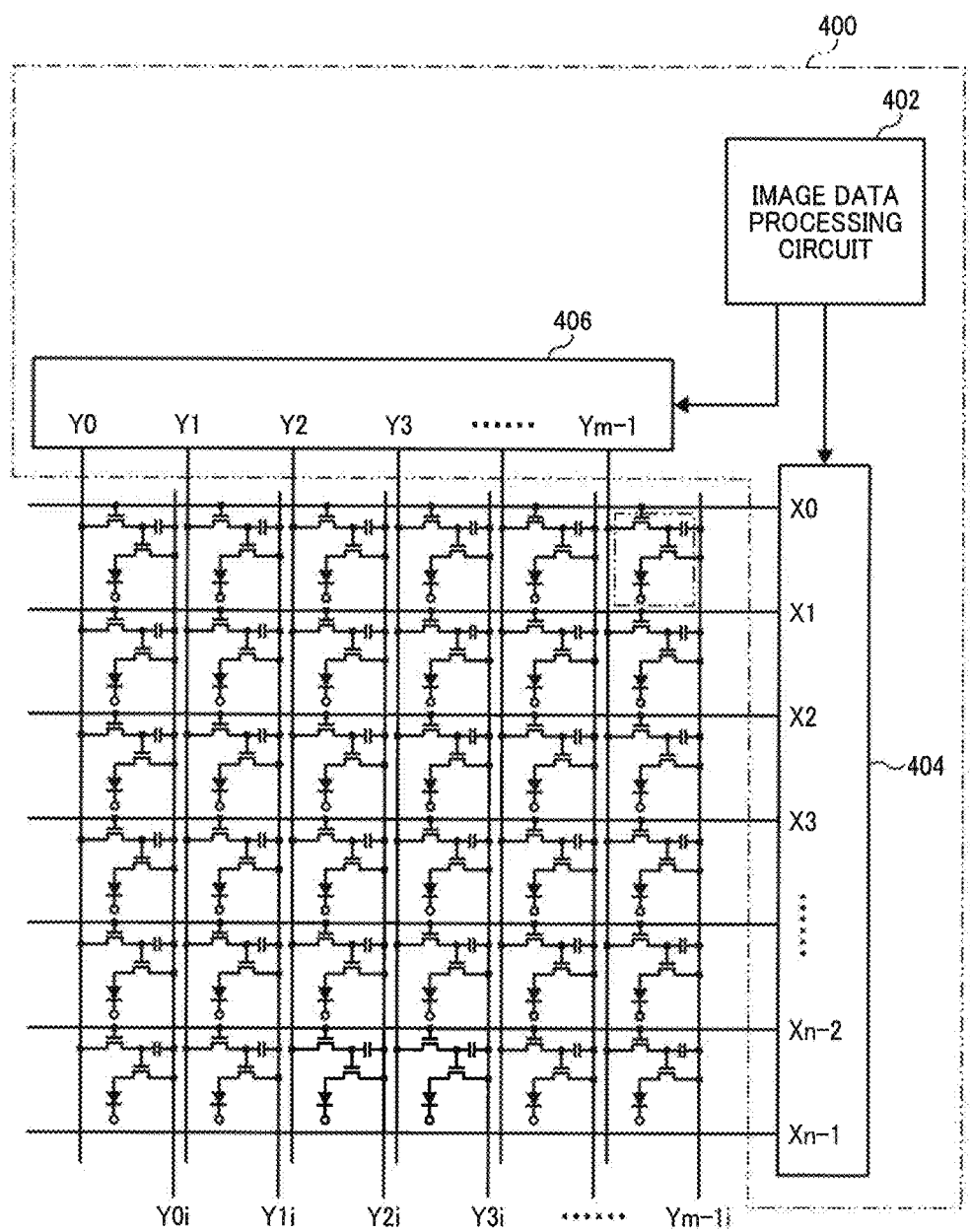
FIG. 7 is a diagram illustrating a description of a display control device.

The display control device 400 includes, for example, an image data processing circuit 402, a scanning line driving circuit 404, and a data line driving circuit 406, as illustrated in FIG. 7.

The image data processing circuit 402 determines the luminance of a plurality of the display elements 302 in the display 310 based on the output signal of an image output The scanning line driving circuit 404 applies individual voltages to the number of n-scanning lines according to the instruction of the image data processing circuit 402.

The data line driving circuit 406 applies individual voltages to the number of m-data lines according to the instruction of the image data processing circuit 402.

In this embodiment, the organic EL thin film layer includes an electron transporting layer, a light emitting layer, and a hole transporting layer, but is not limited thereto. For example, the electron transporting layer and the light emitting layer is not necessarily separated but can form a single layer. In addition, it is possible to provide an electron injecting layer between the electron transporting layer and the cathode. Furthermore, it is possible to provide a hole injecting layer between the hole transporting layer and the anode.

In addition, in this embodiment, so-called "bottom emission" taking out light from the substrate side is described, which does not preclude other possibilities. For example, it is possible to take out light from the other side of the substrate using a high-reflection-ratio electrode formed of an alloy of Ag—Nd as the anode 314 and a semi-transparent electrode of an alloy of Mg and Ag or a transparent electrode of ITO, etc. as the cathode 312.

In addition, in this embodiment, the case in which the light control element is an organic EL element is described, which does not preclude other possibilities. For example, the light control element may be an electrochromic element. In this case, the display 310 is an electrochromic display.

Figure 8:
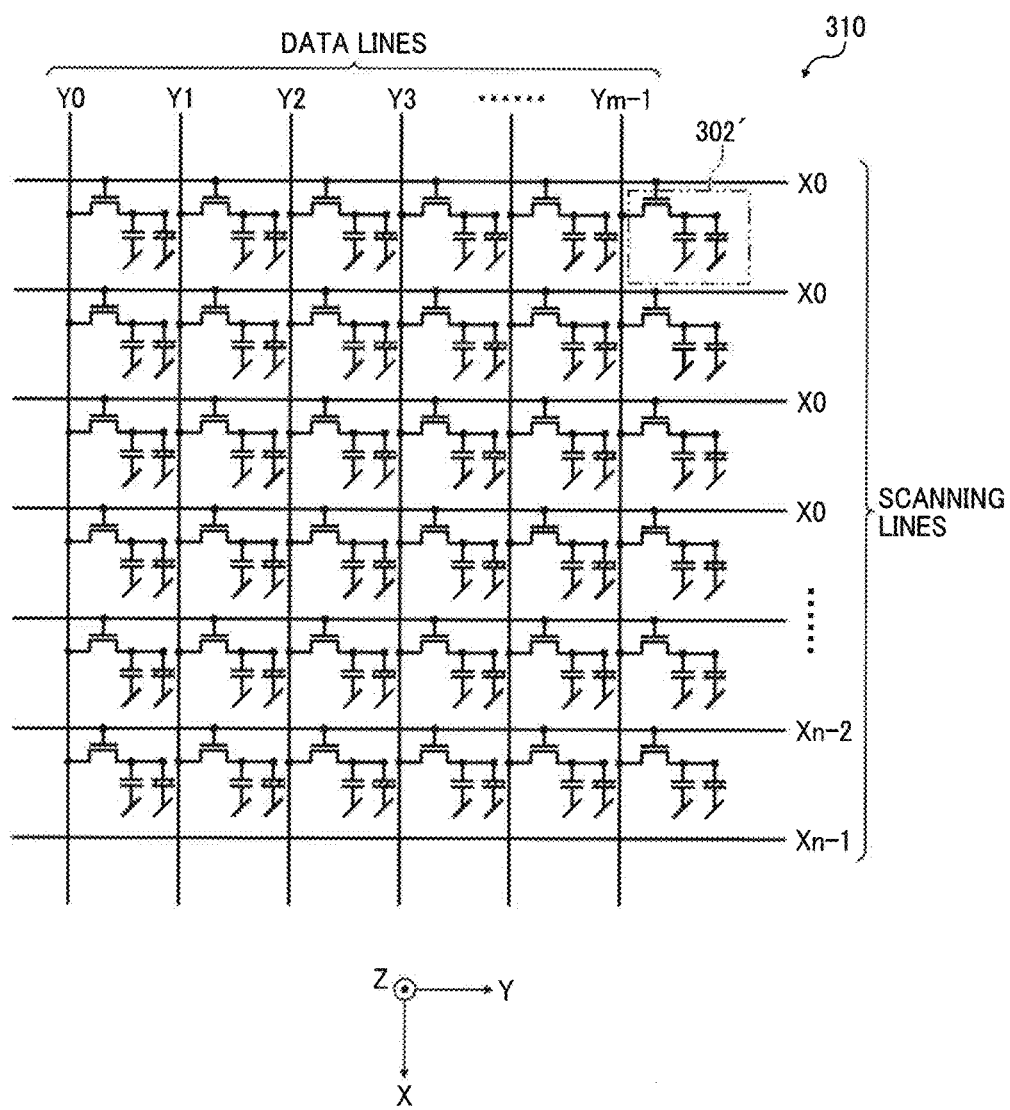
FIG. 8 is a diagram illustrating a description of a liquid display.

In addition, the light control element may be a liquid crystal element. In this case, the display 310 is a liquid crystal display. For example, as illustrated in FIG. 8, no electric current supplying line is required for a display element 302'.

Figure 9:
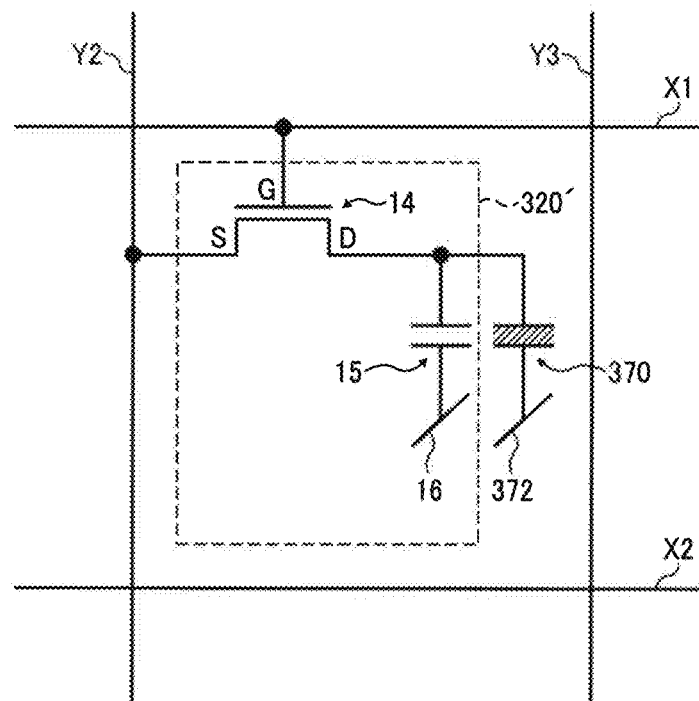
FIG. 9 is a diagram illustrating a description of the display element illustrated in FIG. 8.

In this case, as illustrated in FIG. 9, a driving circuit 320' can be configured by a capacitor 15 and a single field-effect transistor 14 similar to the field-effect transistors 11 and 12 mentioned above. The gate electrode G is connected to a predetermined scanning line and the source electrode S is connected to a predetermined data line in the field-effect transistor 14. In addition, the drain electrode D is connected to a pixel electrode of a liquid crystal element 370 and the capacitor 15.

FIG. 9 also illustrates counter electrodes (common electrodes) 16 and 372 of the liquid crystal element 370.

In this embodiment, the light control element may be an electrophoretic element. In addition, the light control element may be an electrowetting element.

In addition, in this embodiment, the display that supports color is described, which does not preclude other possibilities.

The field-effect transistor of this embodiment can be used for products other than a display element (for example, IC cards and ID tags).

The display element, the image display device, and the system using the field-effect transistor of the present disclosure operates at high speed operation in a long-service life.

Having generally described preferred embodiments of this invention, further understanding can be obtained by reference to certain specific examples which are provided herein for the purpose of illustration only and are not intended to be limiting. In the descriptions in the following examples, the numbers represent weight ratios in parts, unless otherwise specified.

EXAMPLES

Next, the present disclosure is described in detail with reference to Examples but is not limited thereto. Percent represents percent by mass unless otherwise specified.

Example 1

Manufacturing of Field-Effect Transistor

Manufacturing of Gate-Insulating-Layer-Coating Liquid 0.16 mL of HMDS (1,1,1,3,3,3-hexamethyl disilazane, manufactured by TOKYO OHKA KOGYO CO., LTD.) and 0.28 mL of toluene solution of magnesium 2-ethylhexanoate (Strem 12-1260, Content of magnesium: 3 percent by mass, manufactured by Strem Chemicals, Inc.) were mixed with 1 mL of toluene to obtain a gate insulating layer coating liquid. The oxide formed by the gate insulating layer coating liquid has the composition shown in Table 1-1.

Figure 10:
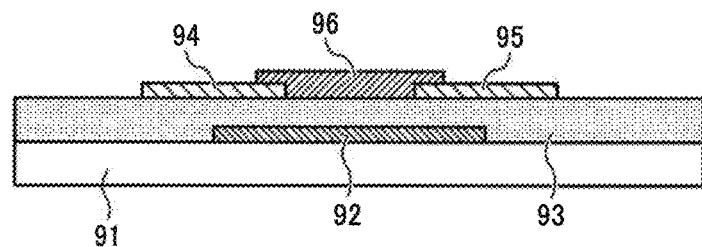
FIG. 10 is a schematic diagram illustrating the field-effect transistor manufactured in Examples 1-3 and Comparative Example 1 and 2 described later.

The field-effect transistor of bottom contact•bottom gate as illustrated in FIG. 10 was manufactured.

Forming of Gate Electrode

First, a gate electrode 92 was formed on a glass substrate (substrate 91). Specifically, molybdenum (Mo) film having an average film thickness of about 100 nm was formed on the glass substrate (substrate 91) by DC sputtering. Thereafter, a photoresist was applied to form the same resist pattern as the pattern of the gate electrode 92 by pre-baking, exposure by an exposing device, and development. Moreover, the Mo film located in the area where no resist pattern was formed was removed by reactive ion etching (RIE). Thereafter, the resist pattern was also removed to form the gate electrode 92 formed of the Mo film.

Forming of Gate Insulating Layer

Next, 0.4 mL of the gate insulating layer coating liquid was dropped to the substrate followed by spin-coating (rotated at 3,000 rpm for 20 seconds and ceased rotation in 5 seconds). Thereafter, subsequent to evaporation treatment at 120 degrees C. for one hour in atmosphere, the resultant was baked at 400 degrees C. for three hours in $O_2$ atmosphere to form an oxide film as a gate insulating layer 93. The average thickness of the gate insulating layer was about 300 nm.

Forming of Source Electrode and Drain Electrode

Next, a source electrode 94 and a drain electrode 95 were formed on the gate insulating layer 93.

Specifically, molybdenum (Mo) film having an average film thickness of about 100 nm was formed on the gate insulating layer 93 by DC sputtering. Thereafter, a photoresist was applied to form on the Mo film the same resist patterns as the patterns of the source electrode 94 and the drain source electrode 95 by pre-baking, exposure by exposure equipment, and development. Moreover, the Mo film located in the area where no resist pattern was formed was removed by reactive ion etching (RIE). Thereafter, the resist pattern was also removed to form the source electrode 94 and the drain electrode 95 formed of the Mo film.

Forming of Oxide Semiconductor Layer

Next, an oxide semiconductor layer 96 was formed. Specifically, Mg—In-based oxide ($In_2MgO_4$) film having an average film thickness of about 100 nm was formed by DC sputtering.

Thereafter, a photoresist was applied to the Mg—In-based oxide film to form the same resist pattern as the pattern of the oxide semiconductor layer 96 by pre-baking, exposure by exposure equipment, and development. Moreover, the Mg—In-based oxide film located in the area where no resist pattern was formed was removed by wet etching. Thereafter, the resist pattern was also removed to form the oxide semiconductor layer 96. As a consequence, the oxide semiconductor layer 96 was formed in such a manner that a channel was formed between the source electrode 94 and the drain electrode 95.

Thereafter, a field-effect transistor was obtained by heating at 300 degrees C. for one hour as the post-process.

Manufacturing of Object Having Cylinder-Like Form to Measure Linear Expansion Coefficient 1 L of the gate insulating layer coating liquid of Example 1 was prepared and the solvent was removed. Thereafter, the resultant was placed in a platinum crucible and melted by heating to 1,600 degrees C. Thereafter, a cylindrical object having a diameter of 5 mm and a height of 10 mm was manufactured by a floating method.

Manufacturing of Capacitor to Evaluate Relative Permittivity

Figure 11:
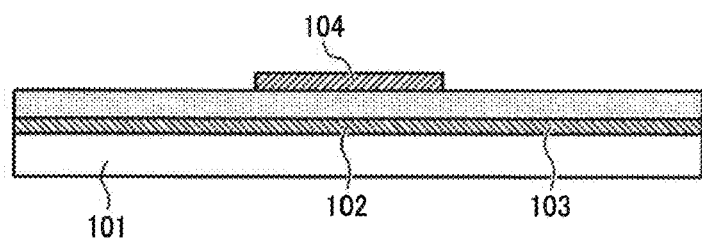
FIG. 11 is a schematic diagram illustrating the capacitor manufactured in Examples 1-3 and Comparative Examples 1 and 2.

Next, a capacitor having the structure illustrated in FIG. 11 was manufactured.

Specifically, using a metal mask having an aperture in the area on which a bottom electrode 102 was formed, aluminum (Al) film was formed on the glass substrate (substrate 101) by vacuum vapor deposition to obtain an average film thickness of about 100 nm. Sequentially, according to the method described in Forming Gate Insulating Layer of the field-effect transistor of Example 1, an insulating thin film 103 having an average film thickness of about 300 nm was formed. Thereafter, using a metal mask having an aperture in the area on which a top electrode 104 was formed, aluminum (Al) film having an average film thickness of about 100 nm was formed by vacuum vapor deposition to complete manufacturing a capacitor.

Example 2

Manufacturing of Gate-Insulating-Layer-Coating Liquid 0.13 mL of HMDS (1,1,1,3,3,3-hexamethyl disilazane, manufactured by TOKYO OHKA KOGYO CO., LTD.) and 0.47 mL of 2-ethylhexanoic acid solution of calcium 2-ethylhexanoate (Alfa36657, Content of calcium: 3-8 percent by mass, manufactured by Alfa Aesar) were mixed with 1 mL of toluene to obtain a gate insulating layer coating liquid. The oxide formed by the gate insulating layer coating liquid has the composition shown in Table 1-1.

Using the prepared gate insulating layer coating liquid, a field-effect transistor, an object having a cylinder-like form for measuring linear expansion coefficient, and a capacitor for evaluating relative permittivity were manufactured according to the same method as the method of Example 1.

Example 3

Manufacturing of Field Effect Transistor, Object Having Cylinder-Like Form for Measuring Linear Expansion Coefficient, and Capacitor for Evaluating Relative Permittivity Manufacturing of Gate-Insulating-Layer-Coating Liquid 0.14 mL of HMDS (1,1,1,3,3,3-hexamethyl disilazane, manufactured by TOKYO OHKA KOGYO CO., LTD.), 0.24 mL of toluene solution of magnesium 2-ethylhexanoate (Strem 12-1260, content of magnesium: 3 percent by mass, manufactured by Strem Chemicals, Inc.), and 0.95 mL of toluene solution of strontium 2-ethylhexanoate (Wako 195-09561, content of Sr: 2 percent by mass, manufactured by WAKO CHEMICAL, LTD.) were mixed with 1 mL of toluene to obtain a gate insulating layer coating liquid. The oxide formed by gate insulating layer coating liquid has the composition shown in Table 1-1.

Using the prepared gate insulating layer coating liquid, a field-effect transistor, an object having a cylinder-like form for measuring linear expansion coefficient, and a capacitor for evaluating relative permittivity were manufactured according to the same method as the method of Example 1.

Example 4

Manufacturing of Field-Effect Transistor, Object Having Cylinder-Like Form for Measuring Linear Expansion Coefficient, and Capacitor for Evaluating Relative Permittivity Manufacturing of Gate-Insulating-Layer-Coating Liquid 0.17 mL of HMDS (1,1,1,3,3,3-hexamethyl disilazane, manufactured by TOKYO OHKA KOGYO CO., LTD.), 0.08 mL of 2-ethylhexanoic acid solution of calcium 2-ethylhexanoate (Alfa36657, Content of calcium: 3-8 percent by mass, manufactured by Alfa Aesar), and 0.19 mL of toluene solution of barium 2-ethylhexanoate (Wako 021-09471, content of Ba: 8 percent by mass, manufactured by WAKO CHEMICAL, LTD.) were mixed with 1 mL of toluene to obtain a gate insulating layer coating liquid. The oxide formed by gate insulating layer coating liquid has the composition shown in Table 1-1.

Using the prepared gate insulating layer coating liquid, a field-effect transistor, an object having a cylinder-like form for measuring linear expansion coefficient, and a capacitor for evaluating relative permittivity were manufactured according to the same method as the method of Example 1.

Example 5

Manufacturing of Field Effect Transistor, Object Having Cylinder-Like Form for Measuring Linear Expansion Coefficient, and Capacitor for Evaluating Relative Permittivity Manufacturing of Gate-Insulating-Layer-Coating Liquid 0.13 mL of HMDS (1,1,1,3,3,3-hexamethyl disilazane, manufactured by TOKYO OHKA KOGYO CO., LTD.), 0.16 mL of 2-ethylhexanoic acid solution of calcium 2-ethylhexanoate (Alfa36657, Content of calcium: 3-8 percent by mass, manufactured by Alfa Aesar), 0.83 mL of toluene solution of strontium 2-ethylhexanoate (Wako 195-09561, content of Sr: 2 percent by mass, manufactured by WAKO CHEMICAL, LTD.), and 0.38 mL of toluene solution of barium 2-ethylhexanoate (Wako 021-09471, content of Ba: 8 percent by mass, manufactured by WAKO CHEMICAL, LTD.) were mixed with 1 mL of toluene to obtain a gate insulating layer coating liquid.

The oxide formed by the gate insulating layer coating liquid has the composition shown in Table 1-1.

Using the prepared gate insulating layer coating liquid, a field-effect transistor, an object having a cylinder-like form for measuring linear expansion coefficient, and a capacitor for evaluating relative permittivity were manufactured according to the same method as the method of Example 1.

Example 6

Manufacturing of Field Effect Transistor, Object Having Cylinder-Like Form for Measuring Linear Expansion Coefficient, and Capacitor for Evaluating Relative Permittivity Manufacturing of Gate-Insulating-Layer-Coating Liquid 0.14 mL of HMDS (1,1,1,3,3,3-hexamethyl disilazane, manufactured by TOKYO OHKA KOGYO CO., LTD.), 0.06 mL of aluminum di(s-butoxide) acetoacetate chelate (Alfa89349, content of Al: 8.4 percent, manufactured by Alfa Aesar), and 0.51 mL of toluene solution of barium 2-ethylhexanoate (Wako 021-09471, content of Ba: 8 percent by mass, manufactured by WAKO CHEMICAL, LTD.) were mixed with 1 mL of toluene to obtain a gate insulating layer coating liquid.

The oxide formed by the gate insulating layer coating liquid has the composition shown in Table 1-2.

Using the prepared gate insulating layer coating liquid, a field-effect transistor, an object having a cylinder-like form for measuring linear expansion coefficient, and a capacitor for evaluating relative permittivity were manufactured according to the same method as the method of Example 1.

Example 7

Manufacturing of Field Effect Transistor, Object Having Cylinder-Like Form for Measuring Linear Expansion Coefficient, and Capacitor for Evaluating Relative Permittivity Manufacturing of Gate-Insulating-Layer-Coating Liquid 0.15 mL of HMDS (1,1,1,3,3,3-hexamethyl disilazane, manufactured by TOKYO OHKA KOGYO CO., LTD.), 0.06 g of (4,4,5,5-tetramethyl-1,3,2-dioxaborolan-2-yl)benzene (Wako 325-59912, manufactured by WAKO CHEMICAL, LTD.), 0.07 mL of toluene solution of magnesium 2-ethylhexanoate (Strem 12-1260, content of magnesium: 3 percent by mass, manufactured by Strem Chemicals, Inc.), and 0.23 mL of toluene solution of strontium 2-ethylhexanoate (Wako 195-09561, content of Sr: 2 percent by mass, manufactured by WAKO CHEMICAL, LTD.) were mixed with 1 mL of toluene to obtain a gate insulating layer coating liquid.

The oxide formed by the gate insulating layer coating liquid has the composition shown in Table 1-2.

Using the prepared gate insulating layer coating liquid a field-effect transistor, an object having a cylinder-like form for measuring linear expansion coefficient, and a capacitor for evaluating relative permittivity were manufactured according to the same method as the method of Example 1.

Example 8

Manufacturing of Field Effect Transistor, Object Having Cylinder-Like Form for Measuring Linear Expansion Coefficient, and Capacitor for Evaluating Relative Permittivity Manufacturing of Gate-Insulating-Layer-Coating Liquid 0.13 mL of HMDS (1,1,1,3,3,3-hexamethyl disilazane, manufactured by TOKYO OHKA KOGYO CO., LTD.), 0.08 mL of aluminum di(s-butoxide) acetoacetate chelate (Alfa89349, content of Al: 8.4 percent, manufactured by Alfa Aesar), 0.13 mL of 2-ethylhexanoic acid solution of calcium 2-ethylxanoate (Alfa36657, content of Ca: 3-8 percent by mass, manufactured by Alfa Aesar), and 0.64 mL of toluene solution of strontium 2-ethylhexanoate (Wako 195-09561, content of Sr: 2 percent by mass, manufactured by WAKO CHEMICAL, LTD.) were mixed with 1 mL of toluene to obtain a gate insulating layer coating liquid.

The oxide formed by the gate insulating layer coating liquid has the composition shown in Table 1-2.

Using the prepared gate insulating layer coating liquid, a field-effect transistor, an object having a cylinder-like form for measuring linear expansion coefficient, and a capacitor for evaluating relative permittivity were manufactured according to the same method as the method of Example 1.

Example 9

Manufacturing of Field Effect Transistor, Object Having Cylinder-Like Form for Measuring Linear Expansion Coefficient, and Capacitor for Evaluating Relative Permittivity Manufacturing of Gate-Insulating-Layer-Coating Liquid 0.11 mL of HMDS (1,1,1,3,3,3-hexamethyl disilazane, manufactured by TOKYO OHKA KOGYO CO., LTD.), 0.12 g of (4,4,5,5-tetramethyl-1,3,2-dioxaborolan-2-yl)benzene (Wako 325-59912, manufactured by WAKO CHEMICAL, LTD.), and 0.18 mL of toluene solution of magnesium 2-ethylhxanoate (Strem 12-1260, content of magnesium: 3 percent by mass, manufactured by Strem Chemicals, Inc.) were mixed with 1 mL of toluene to obtain a gate insulating layer coating liquid.

The oxide formed by the gate insulating layer coating liquid has the composition shown in Table 1-2.

Using the prepared gate insulating layer coating liquid, a field-effect transistor, an object having a cylinder-like form for measuring linear expansion coefficient, and a capacitor for evaluating relative permittivity were manufactured according to the same method as the method of Example 1.

Example 10

Manufacturing of Field Effect Transistor, Object Having Cylinder-Like Form for Measuring Linear Expansion Coefficient, and Capacitor for Evaluating Relative Permittivity Manufacturing of Gate-Insulating-Layer-Coating Liquid 0.13 mL of HMDS (1,1,1,3,3,3-hexamethyl disilazane, manufactured by TOKYO OHKA KOGYO CO., LTD.), 0.06 mL of aluminum di(s-butoxide) acetoacetate chelate (Alfa89349, content of Al: 8.4 percent, manufactured by Alfa Aesar), 0.07 g of (4,4,5,5-tetramethyl-1,3,2-dioxaborolan-2-yl)benzene (Wako 325-59912, manufactured by WAKO CHEMICAL, LTD.), 0.07 mL of 2-ethylhexanoic acid solution of calcium 2-ethylhexanoate (Alfa36657, content of Ca: 3-8 percent by mass, manufactured by Alfa Aesar), and 0.14 mL of toluene solution of strontium 2-ethylhexanoate (Wako 195-09561, content of Sr: 2 percent by mass, manufactured by WAKO CHEMICAL, LTD.) were mixed with 1 mL of toluene to obtain a gate insulating layer coating liquid.

The oxide formed by gate insulating layer coating liquid has the composition shown in Table 1-2.

Using the prepared gate insulating layer coating liquid, a field-effect transistor, an object having a cylinder-like form for measuring linear expansion coefficient, and a capacitor for evaluating relative permittivity were manufactured according to the same method as the method of Example 1.

Example 11

Manufacturing of Field Effect Transistor, Object Having Cylinder-Like Form for Measuring Linear Expansion Coefficient, and Capacitor for Evaluating Relative Permittivity Manufacturing of Gate-Insulating-Layer-Coating Liquid 0.14 mL of HMDS (1,1,1,3,3,3-hexamethyl disilazane, manufactured by TOKYO OHKA KOGYO CO., LTD.), 0.07 mL of aluminum di(s-butoxide) acetoacetate (Alfa89349, content of Al: 8.4 percent, manufactured by Alfa Aesar), 0.02 g of (4,4,5,5-tetramethyl-1,3,2-dioxaborolan-2-yl)benzene (Wako 325-59912, manufactured by WAKO CHEMICAL, LTD.), and 0.11 mL of toluene solution of magnesium 2-ethylhexanoate (Strem 12-1260, Content of magnesium: 3 percent by mass, manufactured by Strem Chemicals, Inc.) were mixed with 1 mL of toluene to obtain a gate insulating layer coating liquid.

The oxide formed by the gate insulating layer coating liquid has the composition shown in Table 1-3.

Using the prepared gate insulating layer coating liquid, a field-effect transistor, an object having a cylinder-like form for measuring linear expansion coefficient, and a capacitor for evaluating relative permittivity were manufactured according to the same method as the method of Example 1.

Example 12

Manufacturing of Field-Effect Transistor, Object Having Cylinder-Like Form for Measuring Linear Expansion Coefficient, and Capacitor for Evaluating Relative Permittivity Manufacturing of Gate-Insulating-Layer-Coating Liquid 0.11 mL of HMDS (1,1,1,3,3,3-hexamethyl disilazane, manufactured by TOKYO OHKA KOGYO CO., LTD.), 0.06 mL of aluminum di(s-butoxide) acetoatetate chelate (Alfa89349, content of Al: 8.4 percent, manufactured by Alfa Aesar), 0.07 g of (4,4,5,5-tetramethyl-1,3,2-dioxaborolan-2-yl)benzene (Wako 325-59912, manufactured by WAKO CHEMICAL, LTD.), 0.03 mL of 2-ethylhexanoic acid solution of calcium 2-ethylhexanoate (Alfa36657, content of Ca: 3-8 percent by mass, manufactured by Alfa Aesar), and 0.48 mL of toluene solution of barium 2-ethylhexanoate (Wako 021-09471, content of Ba: 8 percent by mass, manufactured by WAKO CHEMICAL, LTD.) were mixed with 1 mL of toluene to obtain a gate insulating layer coating liquid.

The oxide formed by the gate insulating layer coating liquid has the composition shown in Table 1-3.

Using the prepared gate insulating layer coating liquid, a field-effect transistor, an object having a cylinder-like form for measuring linear expansion coefficient, and a capacitor for evaluating relative permittivity were manufactured according to the same method as the method of Example 1.

Example 13

Manufacturing of Field-Effect Transistor, Object Having Cylinder-Like Form for Measuring Linear Expansion Coefficient, and Capacitor for Evaluating Relative Permittivity
  Manufacturing of Gate-Insulating-Layer Coating Liquid
  0.11 mL of HMDS (1,1,1,3,3,3-hexamethyl disilazane, manufactured by TOKYO OHKA KOGYO CO., LTD.), 0.10 mL of aluminum di(s-butoxide) acetoacetate chelate (Alfa89349, content of Al: 8.4 percent, manufactured by Alfa Aesar), 0.07 g of (4,4,5,5-tetramethyl-1,3,2-dioxaborolan-2-yl)benzene (Wako 325-59912, manufactured by WAKO CHEMICAL, LTD.), 0.09 mL of 2-ethylhexanoic acid solution of calcium 2-ethylhexanoate (Alfa36657, content of Ca: 3-8 percent by mass, manufactured by Alfa Aesar), and 0.19 mL of toluene solution of strontium 2-ethylhexanoate (Wako 195-09561, content of Sr: 2 percent by mass, manufactured by WAKO CHEMICAL, LTD.) were mixed with 1 mL of toluene to obtain a gate insulating layer coating liquid.

The oxide formed by gate insulating layer coating liquid has the composition shown in Table 1-3.

Using the prepared gate insulating layer coating liquid, a field-effect transistor, an object having a cylinder-like form for measuring linear expansion coefficient, and a capacitor for evaluating relative permittivity were manufactured according to the same method as the method of Example 1.

Comparative Example 1

Manufacturing of Field-Effect Transistor, Object Having Cylinder-Like Form for Measuring Linear Expansion Coefficient, and Capacitor for Evaluating Relative Permittivity
  Manufacturing of Gate-Insulating-Layer-Coating Liquid
  0.19 mL of HMDS (1,1,1,3,3,3-hexamethyl disilazane, manufactured by TOKYO OHKA KOGYO CO., LTD.) was mixed with 1 mL of toluene to obtain a gate insulating layer coating liquid.

The oxide formed by gate insulating layer coating liquid has the composition shown in Table 1-3.

Using the gate insulating layer coating liquid, a field-effect transistor, an object having a cylinder-like form for measuring linear expansion coefficient, and a capacitor for evaluating relative permittivity were manufactured according to the same method as the method of Example 1.

Comparative Example 2

Manufacturing of Field-Effect Transistor
  A gate electrode was manufactured on a glass substrate in the same manner as in Example 1.
  Forming Gate Insulating Layer
  Next, using $SiCl_4$ as a raw material, a $SiO_2$ layer as an gate insulating layer was formed on the substrate and the gate insulating layer mentioned above according to plasma enhanced chemical vapor deposition (PECVD) method. The average thickness of the gate insulating layer was about 300 nm.
  Next, as in the method in Example 1, a source electrode, a drain electrode, and an oxide semiconductor layer were formed followed by heating process to complete a field-effect transistor.
  Manufacturing of Object Having Cylinder-Like Form to Measure Linear Expansion Coefficient
  $SiCl_4$ as a raw material was subject to hydrolysis in oxyhydrogen flame to obtain silica powder. The thus-obtained silica powder was grown to obtain $SiO_2$ porous solid. Thereafter, the $SiO_2$ porous solid was placed in a platinum crucible and melted by heating at 1,600 degrees C. Thereafter, a cylindrical object having a diameter of 5 mm and a height of 10 mm was manufactured by a float method.
  Manufacturing of Capacitor to Evaluate Relative Permittivity
  As in the same manner as in Example 1, using a metal mask having an aperture in the area on which the bottom electrode 102 was formed, aluminum (Al) film was formed on the glass substrate (substrate 101) by vacuum vapor deposition to obtain an average film thickness of about 100 nm.
  Next, using $SiCl_4$ as a raw material, an insulant thin film 103 was formed according to plasma enhanced chemical vapor deposition (PECVD) method.
  Thereafter, using a metal mask having an aperture in the area on which a top electrode 104 was formed, aluminum (Al) film having an average film thickness of about 100 nm was formed by vacuum vapor deposition to complete manufacturing a capacitor.

TABLE 1-1

| | Oxide | Example 1 Oxide molar ratio Mol percent | Example 2 Oxide molar ratio Mol percent | Example 3 Oxide molar ratio Mol percent | Example 4 Oxide molar ratio Mol percent | Example 5 Oxide molar ratio Mol percent |
|---|---|---|---|---|---|---|
| Oxide | $SiO_2$ | 82.5 | 68.8 | 74.4 | 88.9 | 68.1 |
| | $Al_2O_3$ | | | | | |
| | $B_2O_3$ | | | | | |
| | MgO | 17.5 | | 15.0 | | |
| | CaO | | 31.2 | | 5.1 | 10.5 |
| | SrO | | | 10.6 | | 9.2 |
| | BaO | | | | 6.0 | 12.2 |
| | Total | 100.0 | 100.0 | 100.0 | 100.0 | 100.0 |

TABLE 1-2

| Oxide | | Example 6 Oxide molar ratio Mol percent | Example 7 Oxide molar ratio Mol percent | Example 8 Oxide molar ratio Mol percent | Example 9 Oxide molar ratio Mol percent | Example 10 Oxide molar ratio Mol percent |
|---|---|---|---|---|---|---|
| Oxide | $SiO_2$ | 77.5 | 83.4 | 75.5 | 68.7 | 76.3 |
| | $Al_2O_3$ | 5.5 | | 7.5 | | 5.9 |
| | $B_2O_3$ | | 8.8 | | 18.2 | 10.2 |
| | MgO | | 5.0 | | 13.1 | |
| | CaO | | | 9.4 | | 5.8 |
| | SrO | | 2.8 | 7.6 | | 1.8 |
| | BaO | 17.0 | | | | |
| Total | | 100.0 | 100.0 | 100.0 | 100.0 | 100.0 |

TABLE 1-3

| Oxide | | Example 11 Oxide molar ratio Mol percent | Example 12 Oxide molar ratio Mol percent | Example 13 Oxide molar ratio Mol percent | Comparative Example 1 Oxide molar ratio Mol percent | Comparative Example 2 Oxide molar ratio Mol percent |
|---|---|---|---|---|---|---|
| Oxide | $SiO_2$ | 82.1 | 64.0 | 67.5 | 100.0 | 100.0 |
| | $Al_2O_3$ | 7.2 | 5.8 | 10.7 | | |
| | $B_2O_3$ | 3.3 | 10.2 | 11.8 | | |
| | MgO | 7.4 | | | | |
| | CaO | | 2.3 | 7.4 | | |
| | SrO | | | 2.6 | | |
| | BaO | | 17.7 | | | |
| Total | | 100.0 | 100.0 | 100.0 | 100.0 | 100.0 |

Evaluation on Peeling-Off of Field Effect Transistor

Appearances of the field-effect transistors manufactured in Examples 1-13 and Comparative Example 1 and 2 were evaluated and the results are shown in Table 2. As seen in Table 2, no peeling-off of the gate electrode, the gate insulating layer, the source electrode, the drain electrode, and the semiconductor layer was observed with regard to the field-effect transistors manufactured in Examples 1-13.

On the other hand, peeling-off occurred between the gate electrode and the gate insulating layer for the field-effect transistors manufactured in Comparative Examples 1 and 2.

Evaluation on Linear Expansion Coefficient

Average linear expansion coefficient of the object having a cylinder-like form of Examples 1-13 and Comparative Examples 1 and 2 was measured in the temperature range of 20-300 degrees C. by a thermomechanical analyzer (8310 series, manufactured by Rigaku Corporation). The results of Examples 1-13 and Comparative Examples 1 and 2 were shown in Table 2.

As seen in Table 2, while the linear expansion coefficient of the object having a cylinder-like form manufactured in Examples 1-13 read $21.7 \times 10^{-7}$-$77.9 \times 10^{-7}$/K, the linear expansion coefficient of the object having a cylinder-like form manufactured in Comparative Examples 1 and 2 was small, i.e., $5.2 \times 10^{-7}$-$5.4 \times 10^{-7}$/K.

The cause of the peeling-off in the field-effect transistors of Comparative Examples 1 and 2 in the evaluation on peeling-off in the field-effect transistor is that thermal stress occurred during the heating process since the linear expansion coefficient of the gate insulating layer is $5.2 \times 10^{-7}$-$5.4 \times 10^{-7}$/K, which was small in comparison with the linear expansion coefficients of the gate electrode, the source electrode, and the drain electrode. On the other hand, with regard to the field-effect transistors of Examples 1-13, no peeling-off occurred because the difference between the linear expansion coefficient of the gate insulating layer and the linear expansion coefficients of the gate electrode, the source electrode, and the drain electrode is small.

Evaluation on Relative Permittivity

Capacity of the capacitors manufactured in Examples 1-13 and Comparative Examples 1 and 2 was measured by LCR meter (4284A, manufactured by Agilent Technologies). Relative permittivity ε calculated by the values of the measured capacity and dielectric loss (tan δ) at a frequency of 1 kHz are shown in Table 2.

Figure 12:
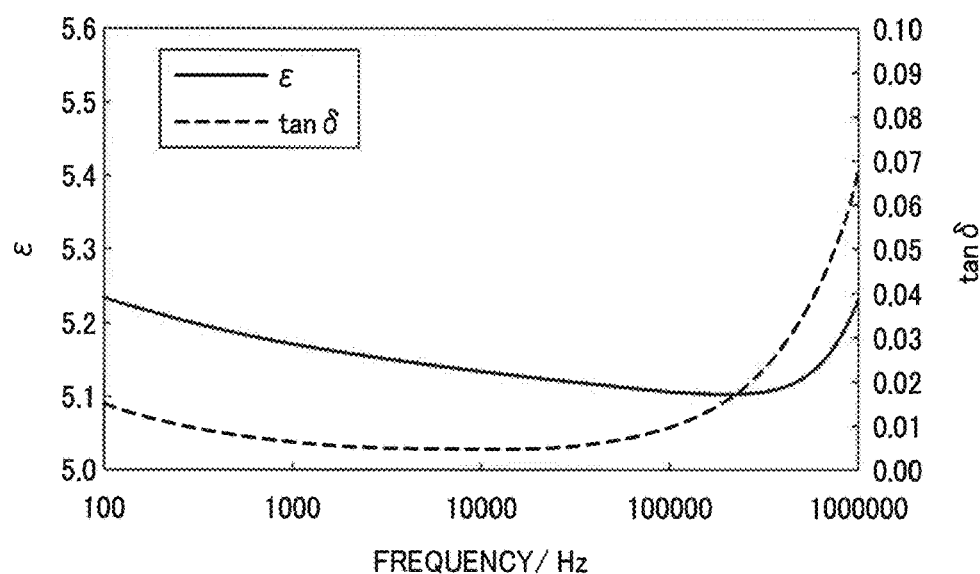
FIG. 12 is a graph to evaluate the relation between the relative permittivity ε and dielectric loss (tan δ) of the capacitor manufactured in Example 13 described later and the frequency of applied electric field.

FIG. 12 is a graph illustrating the relation between relative permittivity ε and dielectric loss (tan δ) in Example 13 and the frequency of the applied electric field. According to FIG. 12, the capacitor manufactured in Example 13 was confirmed to have a relative permittivity of 5.1-5.3 in the range of 100 Hz-1 MHz.

In addition, the value of the dielectric loss (tan δ) was confirmed to be small, which was not greater than about 1 percent in the range of 100 Hz-100 kHz.

Figure 13:
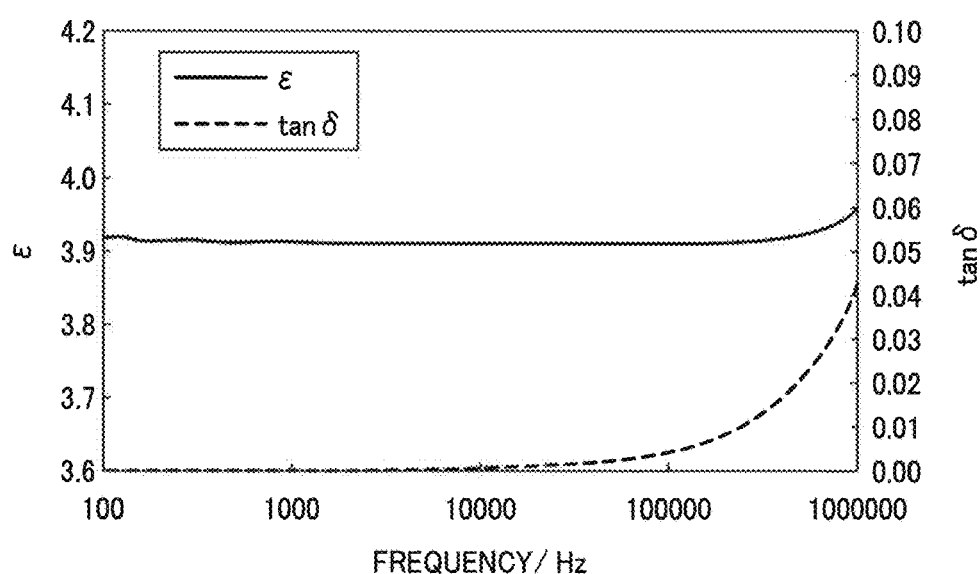
FIG. 13 is a graph to evaluate the relation between the relative permittivity ε and dielectric loss (tan δ) of the capacitor manufactured in Comparative Example 1 and the frequency of applied electric field.

FIG. 13 is a graph illustrating the relation between relative permittivity ε and dielectric loss (tan δ) in Comparative Example 1 and the frequency of the applied electric field. According to FIG. 13, the capacitor manufactured in Comparative Example 1 was confirmed to have a relative permittivity of 3.9-4.0 in the range of 100 Hz-1 MHz. In addition, the value of the dielectric loss (tan δ) was confirmed to be small, which was not greater than about 1 percent in the range of 100 Hz-100 kHz.

Evaluation on Transistor Characteristics of Field Effect Transistor

Transistor characteristics of the field-effect transistors manufactured in Examples 1-13 and Comparative Examples 1 and 2 were evaluated by a semiconductor device parameter analyzer (B1500A, manufactured by Agilent Technologies). As the transistor characteristics, the relation (Vgs-Ids) between the voltage (Vgs) between the gate electrode 92 and the source electrode 94 and the electric current (Ids) between the drain electrode 95 and the source electrode 94 was measured as the voltage (Vds) between the drain electrode 95 and the source electrode 94 was set to +20 V.

In addition, the field-effect mobility in the saturation area was calculated from the evaluation results of the transistor characteristics (Vgs-Ids). In addition, the ratio (on/off ratio) of Ids of on state (for example, Vgs=+10 V) and off state (for example, Vgs=−10 V) of the transistor was calculated.

In addition, subthreshold swing (SS) was calculated as an index of sharpness of rising of Ids to application of Vgs. In addition, a threshold voltage (Vth) was calculated as the voltage value of rising of Ids to application of Vgs.

Figure 14:
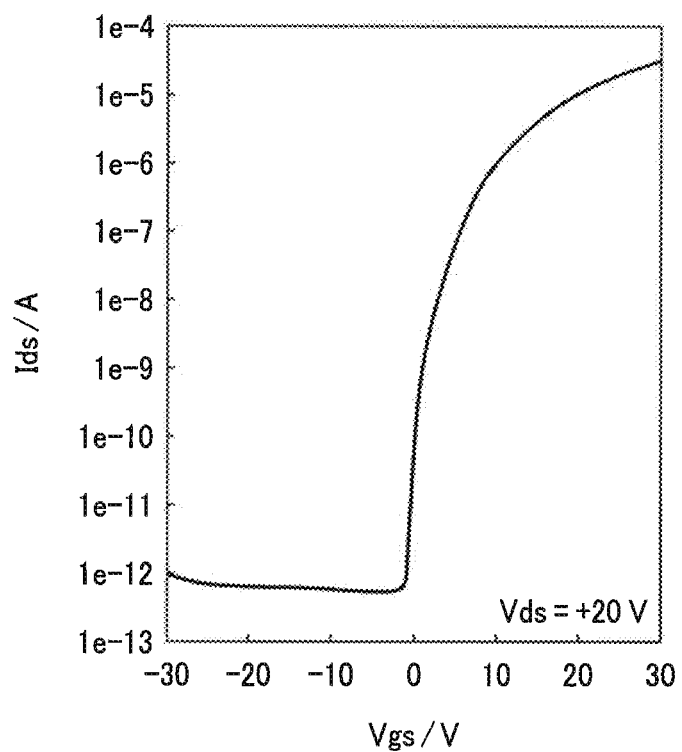
FIG. 14 is a graph to evaluate the transistor characteristics (Vgs-Ids) of the field-effect transistor manufactured in Examples 13.

FIG. 14 is a graph illustrating the result of the transistor characteristics (Vgs-Ids) of the field-effect transistor manufactured in Examples 13. In addition, the mobility, on/off ratio, subthreshold swing (SS), and Vth calculated from the transistor characteristics of the field-effect transistors manufactured in Examples 1-13 and Comparative Examples 1 and 2 are shown in Table 2. In the following, the transistor characteristics are evaluated as excellent when the mobility is high, the on/off ratio is high, the subthreshold swing (SS) is low, and Vth is around 0 V in the results of the transistor characteristics.

"e" of the Y axis of the graph of FIG. 14 represents "the exponent of 10". For example, "1e-3" represents $1.0 \times 10^{-3}$ or 0.001. "1e+5" represents $1.0 \times 10^{+5}$ or 100,000.

As seen in FIG. 14 and Table 2, the field-effect transistor manufactured in Example 13 has excellent transistor characteristics. Similarly, as seen in Table 2, each of the field-effect transistors manufactured in Examples 1-13 has excellent transistor characteristics.

On the other hand, since peeling-off occurred to the field-effect transistors manufactured in Comparative Examples 1 and 2, it was impossible to evaluate the transistor characteristics.

Table of Result

Embodiments of the present disclosure are, for example, as follows.

1. A field-effect transistor including a gate electrode, which is configured to apply gate voltage, a source electrode and a drain electrode, which are configured to take electric current out, a semiconductor layer, which is disposed to be adjacent to the source electrode and the drain electrode, and a gate insulating layer, which is disposed between the gate electrode and the semiconductor layer, wherein the gate insulating layer includes an oxide including silicon and one or two or more alkaline earth metal elements.

2. The field-effect transistor according to 1 mentioned above, wherein the oxide includes aluminum and/or boron.

3. The field-effect transistor according to 1 or 2 mentioned above, wherein the semiconductor layer is an oxide semiconductor.

4. A display element including a light control element to control light output according to a driving signal and a driving circuit including the field-effect transistor according to any one of 1-3 mentioned above and configured to drive the light control element.

5. The display element according to 4 mentioned above, wherein the light control element includes an electroluminescent element, an electrochromic element, a liquid crystal element, an electrophoretic element, and an electrowetting element.

6. An image display device including a plurality of display elements arranged in a form of matrix, each of the plurality of display elements being the display element according to 4 mentioned above, a plurality of wired lines to individually apply gate voltage and signal voltage to the field-effect transistors in the plurality of display elements; and a display control device to individually control the gate voltage and the signal voltage of the field-effect transistors via the plurality of wired lines according to the image data.

7. A system including the image display according to 6 mentioned above and an image data generating device to generate image data based on image information to be displayed and output the image data to the image display device.

8. A composition for a gate insulator (e.g. gate insulating film) of a field-effect transistor including an oxide including silicon and one or more alkaline earth metal elements.

TABLE 2

|  | Peeling-off | Linear expansion coefficient ($\times 10^{-7}$/K) | Relative permittivity | Tanδ [$\times 10^{-2}$] | Mobility (cm²/Vs) | On/off [$\times 10^8$] | Subthreshold swing (SS) [V/decade] | Vth [V] |
| --- | --- | --- | --- | --- | --- | --- | --- | --- |
| Example 1 | No | 29.1 | 4.8 | ≤1 | 3.2 | 1.5 | 0.70 | 7.3 |
| Example 2 | No | 65.5 | 6.7 | ≤1 | 4.0 | 2.0 | 0.66 | 6.6 |
| Example 3 | No | 48.7 | 5.5 | ≤1 | 3.8 | 1.7 | 0.64 | 7.0 |
| Example 4 | No | 32.9 | 5.3 | ≤1 | 3.7 | 1.8 | 0.65 | 6.2 |
| Example 5 | No | 77.9 | 7.1 | ≤1 | 4.1 | 1.9 | 0.60 | 4.8 |
| Example 6 | No | 53.7 | 6.4 | ≤1 | 3.1 | 1.6 | 0.72 | 7.4 |
| Example 7 | No | 25.1 | 4.4 | ≤1 | 3.0 | 1.5 | 0.75 | 6.7 |
| Example 8 | No | 44.4 | 5.7 | ≤1 | 4.6 | 2.3 | 0.52 | 5.8 |
| Example 9 | No | 32.3 | 4.4 | ≤1 | 4.3 | 2.1 | 0.55 | 6.0 |
| Example 10 | No | 30.6 | 4.8 | ≤1 | 4.1 | 2.0 | 0.58 | 6.1 |
| Example 11 | No | 21.7 | 4.6 | ≤1 | 3.8 | 1.7 | 0.68 | 6.4 |
| Example 12 | No | 59.3 | 6.6 | ≤1 | 4.4 | 2.1 | 0.49 | 5.3 |
| Example 13 | No | 36.4 | 5.1 | ≤1 | 4.8 | 2.5 | 0.48 | 4.5 |
| Comparative Example 1 | Yes | 5.2 | 3.9 | ≤1 | Not measurable | Not measurable | Not measurable | Not measurable |
| Comparative Example 2 | Yes | 5.4 | 4.1 | ≤1 | Not measurable | Not measurable | Not measurable | Not measurable |

As described above, the field-effect transistor of the present disclosure is free of peeling-off between the gate electrode, the source electrode and the drain electrode and the gate insulating layer due to heating process.

Having now fully described embodiments of the present invention, it will be apparent to one of ordinary skill in the art that many changes and modifications can be made thereto without departing from the spirit and scope of embodiments of the invention as set forth herein.

What is claimed is:

1. A display element including one or more field-effect transistors, at least one of the field-effect transistors comprising:
    a first gate electrode, to which a gate voltage is applied or to be applied;
    a source electrode and a drain electrode;
    a semiconductor layer, which is disposed adjacent to the source electrode and the drain electrode; and
    a gate insulating layer, which is disposed between the gate electrode and the semiconductor layer,
    the drain electrode being connected via a through hole in the gate insulating layer to a gate electrode of another field-effect transistor,
    wherein the gate insulating layer includes an oxide including silicon and one or two or more alkaline earth metal elements, and
    wherein the oxide is represented by the following compositional formula:

$x\text{SiO}_2 \cdot y\text{AO}$, where x denotes a proportion by mole of $\text{SiO}_2$ included in the oxide, A represents the one or two or more alkaline earth metal elements included in the oxide, y denotes a proportion by mole of AO included in the oxide, and x and y satisfy the following expressions (i) through (iii):

$50 \leq x \leq 90$; (i)

$10 \leq y \leq 50$; and (ii)

$x+y=100$. (iii)

2. The display element according to claim 1, wherein the oxide further includes aluminum and/or boron.

3. The display element according to claim 1, wherein the semiconductor layer is an oxide semiconductor.

4. The display element according to claim 1, further comprising:
    a light control element configured to control light output according to a driving signal; and
    a driving circuit configured to drive the light control element.

5. The display element according to claim 4, wherein the light control element includes an electroluminescent element, an electrochromic element, a liquid crystal element, an electrophoretic element, or an electrowetting element.

6. An image display device comprising:
    a plurality of display elements arranged in a form of matrix, each of the plurality of display elements being the display element according to claim 4;
    a plurality of wired lines configured to individually apply gate voltage and signal voltage to the field-effect transistors in the plurality of display elements; and
    a display control device configured to individually control the gate voltage and the signal voltage of the field-effect transistors via the plurality of wired lines according to image data.

7. A system comprising:
    the image display device according to claim 6; and
    circuitry configured to generate image data based on image information to be displayed and output the image data to the image display device.

8. A display element including one or more field-effect transistors, at least one of the field-effect transistors comprising:
    a first gate electrode, to which a gate voltage is applied or to be applied;
    a source electrode and a drain electrode;
    a semiconductor layer, which is disposed adjacent to the source electrode and the drain electrode; and
    a gate insulating layer, which is disposed between the gate electrode and the semiconductor layer,
    the drain electrode being connected via a through hole in the gate insulating layer to a gate electrode of another field-effect transistor,
    wherein the gate insulating layer includes an oxide including silicon and one or two or more alkaline earth metal elements, and
    wherein the oxide is represented by the following compositional formula:

$x\text{SiO}_2 \cdot y\text{AO} \cdot z\text{J}_2\text{O}_3$, where x denotes a proportion by mole of $\text{SiO}_2$ included in the oxide, A represents the one or two or more alkaline earth metal elements included in the oxide, y denotes a proportion by mole of AO included in the oxide, J represents aluminum and/or boron, z denotes a proportion by mole of $\text{J}_2\text{O}_3$ included in the oxide, and x, y and z satisfy the following expression (i) through (iv):

$50 \leq x \leq 90$; (i)

$5 \leq y \leq 20$; (ii)

$5 \leq z \leq 30$; and (iii)

$x+y+z=100$. (iii)

* * * * *